United States Patent [19]
Idei et al.

[11] Patent Number: 5,629,898
[45] Date of Patent: May 13, 1997

[54] DYNAMIC MEMORY DEVICE, A MEMORY MODULE, AND A METHOD OF REFRESHING A DYNAMIC MEMORY DEVICE

[75] Inventors: Youji Idei, Asaka; Katsuhiro Shimohigashi, Musashimurayama; Masakazu Aoki, Tokorozawa; Hiromasa Noda, Tokyo; Katsuyuki Sato, Akishima; Hidetoshi Iwai; Makoto Saeki, both of Ome; Jun Murata, Kunitachi; Yoshitaka Tadaki, Hannou; Toshihiro Sekiguchi, Hidaka; Osamu Tsuchiya, Hamura, all of Japan

[73] Assignee: Hitachi, Ltd., Tokyo, Japan

[21] Appl. No.: 607,977

[22] Filed: Feb. 29, 1996

[30] Foreign Application Priority Data

Mar. 3, 1995 [JP] Japan ..................................... 7-068976
Aug. 25, 1995 [JP] Japan ..................................... 7-240729

[51] Int. Cl.$^6$ ..................................................... G11C 7/00
[52] U.S. Cl. .................. 365/222; 365/230.03; 365/236; 365/233; 365/195
[58] Field of Search .............................. 365/222, 230.03, 365/236, 233, 195

[56] References Cited

FOREIGN PATENT DOCUMENTS 51-127629  11/1976  Japan .
61-217988  9/1986  Japan .

Primary Examiner—David C. Nelms
Assistant Examiner—F. Niranjan
Attorney, Agent, or Firm—Antonelli, Terry, Stout & Kraus, LLP

[57] ABSTRACT

A period pulse corresponding to the shortest information retention time of those of dynamic memory cells is counted to form a refresh address to be assigned to a plurality of word lines. A carry signal outputted from the refresh address counter is divided by a divider. For each of said plurality of word lines assigned with the refresh address, one of a short period corresponding to an output pulse of a timer or a long period corresponding to the divided pulse from the divider is stored in a storage circuit as refresh time setting information. A memory cell refresh operation to be performed by the refresh address is made valid or invalid for each word line according to the refresh time setting information stored in the storage circuit and the refresh time setting information itself is made invalid by the output pulse of the divider.

15 Claims, 25 Drawing Sheets

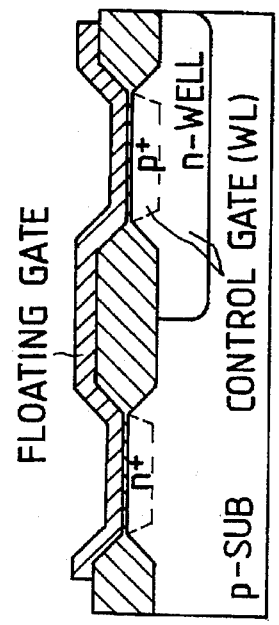
FIG. 16(B) PMOS METHOD
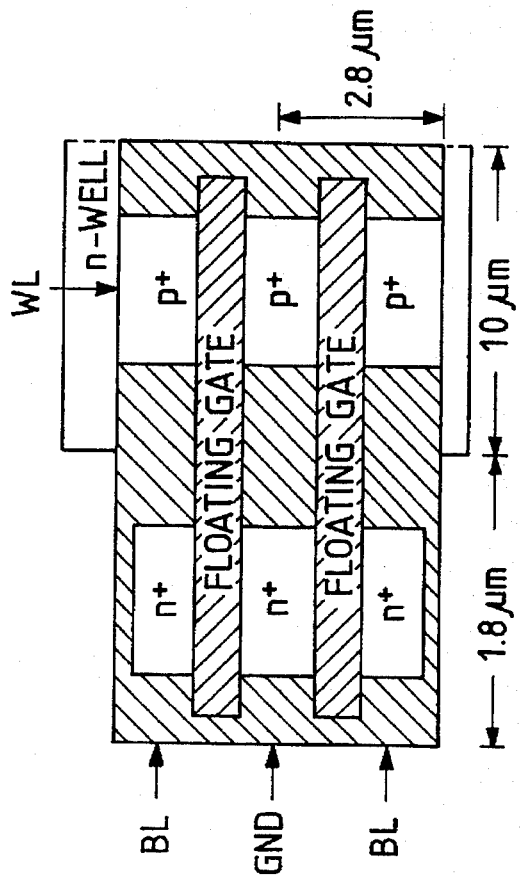
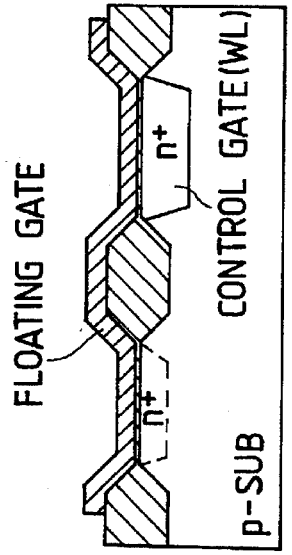
FIG. 16(A) NMOS METHOD
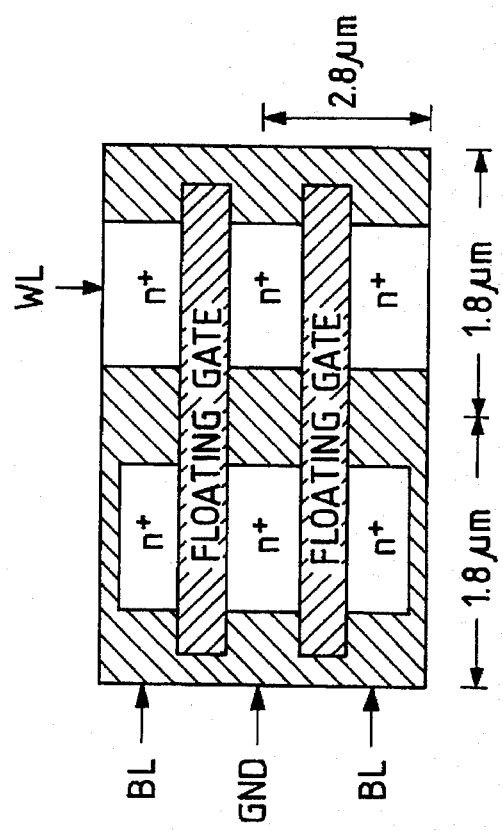

DRAM CELL METHOD

DYNAMIC MEMORY DEVICE, A MEMORY MODULE, AND A METHOD OF REFRESHING A DYNAMIC MEMORY DEVICE

BACKGROUND OF THE INVENTION

The present invention relates to a dynamic RAM (Random Access Memory), a dynamic RAM module, and a method of refreshing them and, more particularly, to a refreshing technique for effective use mainly in RAM and RAM modules of large storage capacities.

A dynamic RAM holds information in an electrical charge form in capacitors, so that a refresh operation is required to prevent the stored information from being lost by reading the information from the memory, amplifying the read information, and restoring the information to its original storage state. Because information storage times of memory cells are not constant, a refreshing technique was proposed in Japanese Non-examined Patent Publication No. 61-217988 in which an address of a word line to be refreshed in a relatively short period is stored. In addition, a refreshing technique was proposed in Japanese Non-examined Patent Publication No. 51-127629 in which the addresses of all word lines are stored in the order in which the word lines are refreshed.

SUMMARY OF THE INVENTION

Information retention times of dynamic memory cells are continuously distributed, from short to long, as shown in FIG. 26 and they are also different in each of the samples. In the conventional dynamic RAMs, its refresh period is set with reference to the shortest information retention time, so that the number of refresh times becomes higher than actual performance of many dynamic memory cells, thereby increasing their power consumptions. The above-mentioned Japanese Non-examined Patent Publication No. 61-217988 discloses the technique in which the dynamic memory cells having relatively short information retention times are selected to be refreshed in a relatively short refresh period. However, this technique is substantially not applicable to those dynamic memory cells of which information retention times are continuously distributed from short to long as mentioned above.

In the technique in which the short refresh period is stored in memory or the addresses of word lines having short refresh periods and refresh sequence addresses are stored in memory, the refresh operations cannot be performed correctly in accordance with the memory cell retention times if the stored information has an error, directly resulting in the destruction of the information stored in a memory cell. This presents a serious problem in the reliability of the dynamic RAMs.

In the dynamic RAM, if a read/write operation and a refresh operation take place at a same address, a word line having no memory cell at the time of the read/write operation must also be put in the selected state, increasing the current consumption. On the other hand, it is necessary for the refresh operation to be repeated within a memory cell information retention time, so that an increase in the number of word lines in turn increases the number of refresh cycles, most of the operations of the dynamic RAM being occupied by the refresh operations. Consequently, it is practiced, with the increase in dynamic RAM storage capacity, that the number of word lines to be selected at the refresh time is increased over that at the read/write time to hold the number of refresh cycles around 4K (4096). In this case, the number of memory cells that are refreshed simultaneously decreases and, if there is but one memory cell having a relatively short refresh cycle, the entire refresh operation is performed according to this short refresh cycle. Consequently, even if the memory cells are divided into a group having short refresh cycles and another group having long refresh cycles as described before, there remains a problem that the number of memory cells having short refresh cycles increases over the number of memory cells having long refresh cycles.

It is therefore an object of the present invention to provide a dynamic RAM, a memory module, and a method of refreshing them, the dynamic RAM being capable of being refreshed rationally and reliably in accordance with the information retention time of memory cells of large storage capacity. It is another object of the invention to provide a dynamic RAM, a memory module and a method of refreshing them, the dynamic RAM being designed for low power consumption in standby mode. The above and other objects, features and advantages of the present invention will become more apparent from the accompanying drawings, in which like reference numerals are used to identify the same or similar parts in several views.

The invention disclosed herein will be typically outlined as follows. Namely, a refresh address to be commonly assigned to a plurality of word lines is generated by counting periodic pulses corresponding to a refresh period set shorter than the shortest information retention time of the information retention times of the above-mentioned dynamic memory cells. A carry signal from a refresh address counter that has counted the periodic pulses is divided by a divider. Either a short period equivalent to the output pulse of a timer circuit or a long period equivalent to the divided output pulse is stored in a memory circuit for each of the plurality of word lines assigned to the refresh address. A memory cell refresh operation to be performed by the refresh address is made valid or invalid for each word line according to the information stored in the memory circuit. The refresh time setting information is made invalid by the output pulse of the divider.

According to the above-mentioned means, a refresh operation may be performed by two or more refresh periods corresponding to memory cell information retention time for each of the plurality of word lines commonly assigned with the above-mentioned refresh address, resulting in significant power saving.

BRIEF DESCRIPTION OF THE DRAWINGS

FIG. 16 (A) and FIG. 16 (B) are schematic diagrams illustrating one preferred embodiment of a memory cell used for a PROM array of an adaptive refresh controller installed on the dynamic RAM associated with the invention;

DETAILED DESCRIPTION OF PREFERRED EMBODIMENTS

Figure 1:
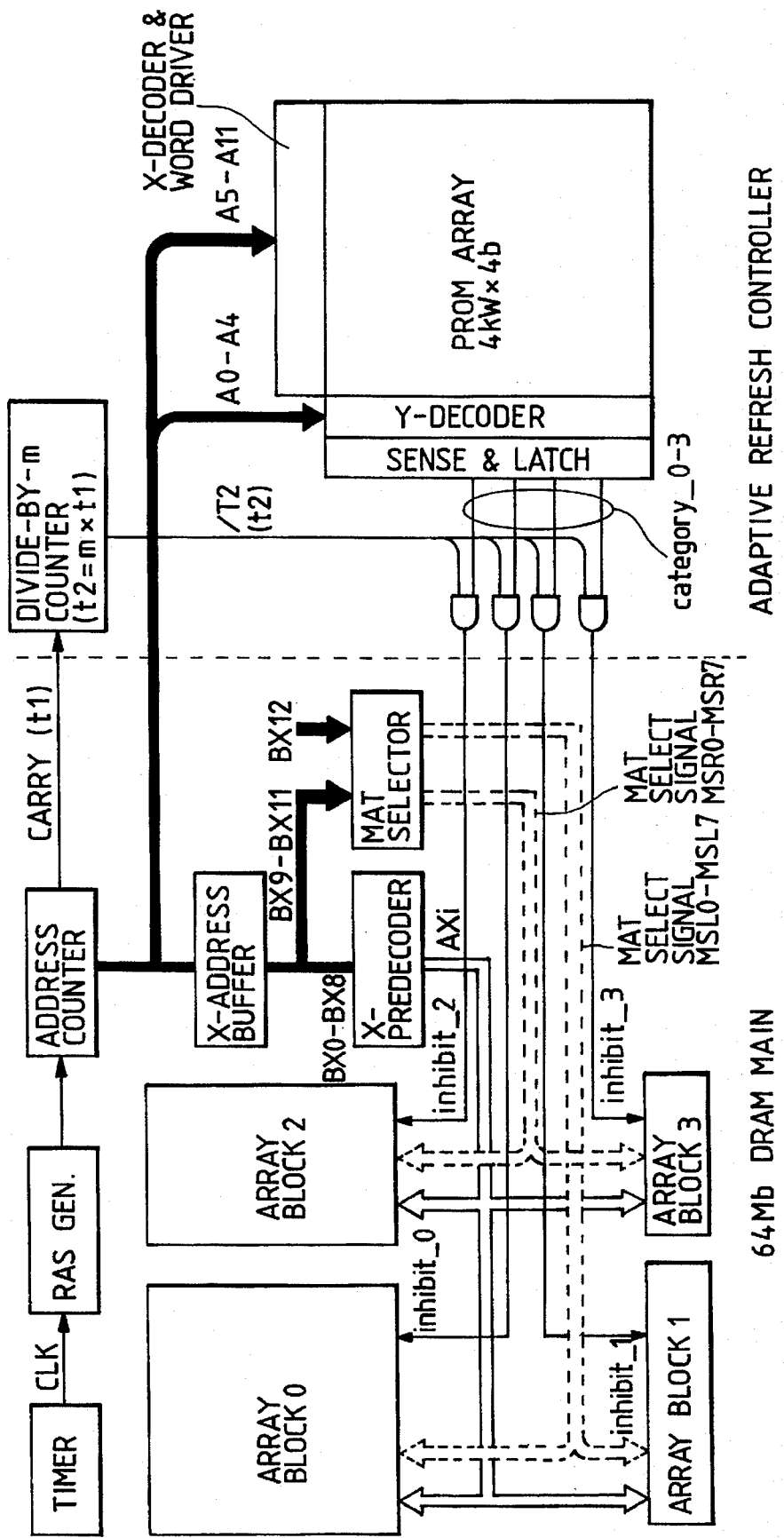
FIG. 1 is a schematic block diagram illustrating the dynamic RAM practiced as one preferred embodiment of the invention.

This invention will be described in further detail by way of example with reference to the accompanying drawings.

Now, referring to FIG. 1, there is shown a schematic block diagram illustrating a dynamic RAM (Random Access Memory) (hereinafter referred to simply as a DRAM) practiced as one preferred embodiment of the present invention. Each of the circuit blocks in the figure is formed on one semiconductor substrate such as a single silicon crystal, but not limited thereto, by a known semiconductor integrated circuit fabrication technology.

The DRAM practiced as one preferred embodiment of the present invention is composed of a DRAM main and an adaptive refresh controller. The DRAM main has a large storage capacity of about 64 Mb (megabits), but not limited thereto. The DRAM main is composed of, but not necessarily, four memory blocks (array blocks). Each of the array blocks 0 through 3 has a storage capacity of about 16 Mb. In a refresh operation, a word line WL provided on each array block is selected, an electric charge stored in a memory cell connected to the word line is read, and the read electric charge is amplified by a sense amplifier to be restored to its original state.

It should be noted that there is physically only one word line in each array block; the above-mentioned word line denotes a logical word line corresponding to refresh addresses. Namely, when one array block has the storage capacity of about 16 Mb, it is necessary to refresh 4096 memory cells in a single refresh operation. If these many memory cells are connected to one word line, its load gets heavy to slow down the refresh operation speed. Consequently, the word line is divided and the resultant multiple word lines are assigned with a same row address to be selected simultaneously.

Refresh address signals A0 through A11 for performing the above-mentioned refresh operation are created by a refresh address counter. A timer generates a clock signal CLK that matches in frequency with any of the above-mentioned memory cells having the 64 Mb storage capacity in total that has a shortest information retention time. In a refresh operation in which one refresh cycle is made up of 4096 refresh operations by the above-mentioned refresh address signals A0 through A11, let the above-mentioned shortest information retention time be Tmin, then the timer generates the clock signal CLK having a period shorter than Tmin/4096.

A timing generator RAS Gert generates a row timing signal in synchronization with the above-mentioned clock signal CLK to control an operation of selecting a word line specified by the above-mentioned refresh address signal A0 through A11 and an operation of amplification by the sense amplifier, thereby effecting a refresh operation. The above-mentioned address counter is incremented by one by the timing signal caused by the refresh operation by the timing generator RAS Gen, thereby generating a next refresh address. The refresh controller such as this is basically similar to a refresh controller provided on a conventional dynamic RAM.

In the present embodiment, a following adaptive refresh controller is provided on the DRAM main having the above-mentioned refresh controller in order to perform objectives such as lowering the power consumption in a data retaining operation (or in standby mode).

The refresh address signals A0 through A11 generated by the above-mentioned address counter are supplied to a programmable read-only memory (hereinafter referred to simply as a PROM). The PROM (actually, a refresh period retention circuit) has an address space for 4K bits corresponding to the refresh addresses. Each address in the 4 Kb address space has 4-bit storage information corresponding to each of the four array blocks 0 through 3 of the above-mentioned DRAM main. Therefore, the memory capacity of the entire PROM array is 4K×4=16K bits.

A carry signal CARRY coming from the above-mentioned address counter is divided by a divide-by-m counter into 1/m. That is, with respect to the number of refresh times for a particular memory cell, the divide-by-m counter forms a divided pulse that is generated once in m refreshes. Conversely, the counter forms a divided pulse /T2 (t2=m×t1) set a length of times m for one refresh period t1 of a memory cell having the shortest information retention time as described before.

Of the refresh address signals A0 through A11 formed by the above-mentioned address counter, the address signals A0 through A4 corresponding to the lower-order five bits are supplied to a Y-decoder of the PROM array, while the address signals A5 through A11 are supplied to an X-decoder (a word driver), but not limited thereto. The above-mentioned PROM array has storage information of four bits corresponding to a total of four word lines respectively specified by the refresh addresses A0 through A11 in the four memory mats on the DRAM main. The storage information is stored corresponding to binary ('0' and '1') refresh time setting information (information about refresh period) to distinguish between short and long refresh periods. The refresh address signals formed by the address counter are also captured into the DRAM main via an X-address buffer that has multiplexing capability. Resultant internal address signals BX0 through BX8 are supplied to an X-predecoder, while resultant internal address signals are supplied to a mat selector. That is, when one word line of one of the arrays is observed for example, an interval between selecting the word line and selecting the same word line again is defined as the above-mentioned refresh time setting information (the information about refresh period).

To the above-mentioned mat selector, the internal address signal BX12 is supplied in a normal access operation, the BX12 being the most significant bit among the internal address signal bits. In the refresh mode, the internal address signal BX12 is made invalid, in turn making invalid the memory block selecting capability to be realized by the BX12, putting the both in the selected state.

Read signals of four bits from the PROM array are held in a latch via the sense amplifier. For power saving of the adaptive refresh controller, when the 4-bit data have been read and held in the output latch upon entry of the above-mentioned address signals, all circuits comprising the adaptive refresh controller including the sense amplifier are put in the inactive state.

In FIG. 1, the refresh setting information (category-0-3) of four bits read from the PROM is logically multiplied in AND gates by the divided pulse /T2 formed by the divide-by-m counter to form refresh inhibit signals inhibit-0 through inhibit-3 corresponding to the above-mentioned array blocks 0 through 3. The refresh inhibit signal inhibit-0 is supplied to the array block 0. Likewise, the remaining refresh inhibit signals inhibit-1 through inhibit-0 are supplied to the array blocks 1 through 3 respectively.

It should be noted that signal /T2 is an active low signal. Therefore, the divided pulse /T2 is normally high, and when the above-mentioned carry signal CARRY has been counted m times, goes low. When performing a refresh operation by the above-mentioned refresh address signals A0 through A11, if the above-mentioned refresh time setting information (category-0) is '0' (low level) corresponding to short period, the refresh inhibit signal inhibit-0 is set to '0' unconditionally, performing the refresh operation.

If the above-mentioned refresh time setting information (category-0) is '1' (high level) corresponding to long period, the refresh inhibit signal inhibit-0 is set to '1' (high level) while the divided pulse /T2 is high to inhibit the refresh operation, skipping that refresh cycle. Even if the refresh time setting information (category-0) is '1' (high level) corresponding to long period, the divided pulse /T2 is set to low level once in m times, so that the refresh inhibit signal inhibit-0 is set by the above-mentioned AND gate to '0' (low level). Consequently, on a word line for which the refresh time setting information (category-0) is of long period, the refresh operation is performed by the time interval set by the divided pulse /T2.

Also in each of the other array blocks 1 through 3, if the refresh time setting information (category-1 through category-3) is '1' (high level" corresponding to long period, each of the refresh inhibit signals inhibit-1 through inhibit-3 goes '1' while the divided pulse /T2 is high to inhibit the refresh operation, skipping that refresh cycle. When the divided pulse /T2 is made low once in m times, the refresh inhibit signals inhibit-1 through inhibit-3 are forcibly made low, or invalid, so that the refresh operation is performed by the time interval set by the divided pulse /T2.

In the embodiment of FIG. 1, whether the refresh operation of long period is performed or not is controlled for each of the array blocks 0 through 3. In this method, the refresh time can be set in a smaller unit (in a unit of a word line) than in the collective specification by the refresh addresses (A0 through A11). This increases the number of memory cells to be refreshed in long period, thereby lowering the power necessary for the refresh operation.

Figure 2:
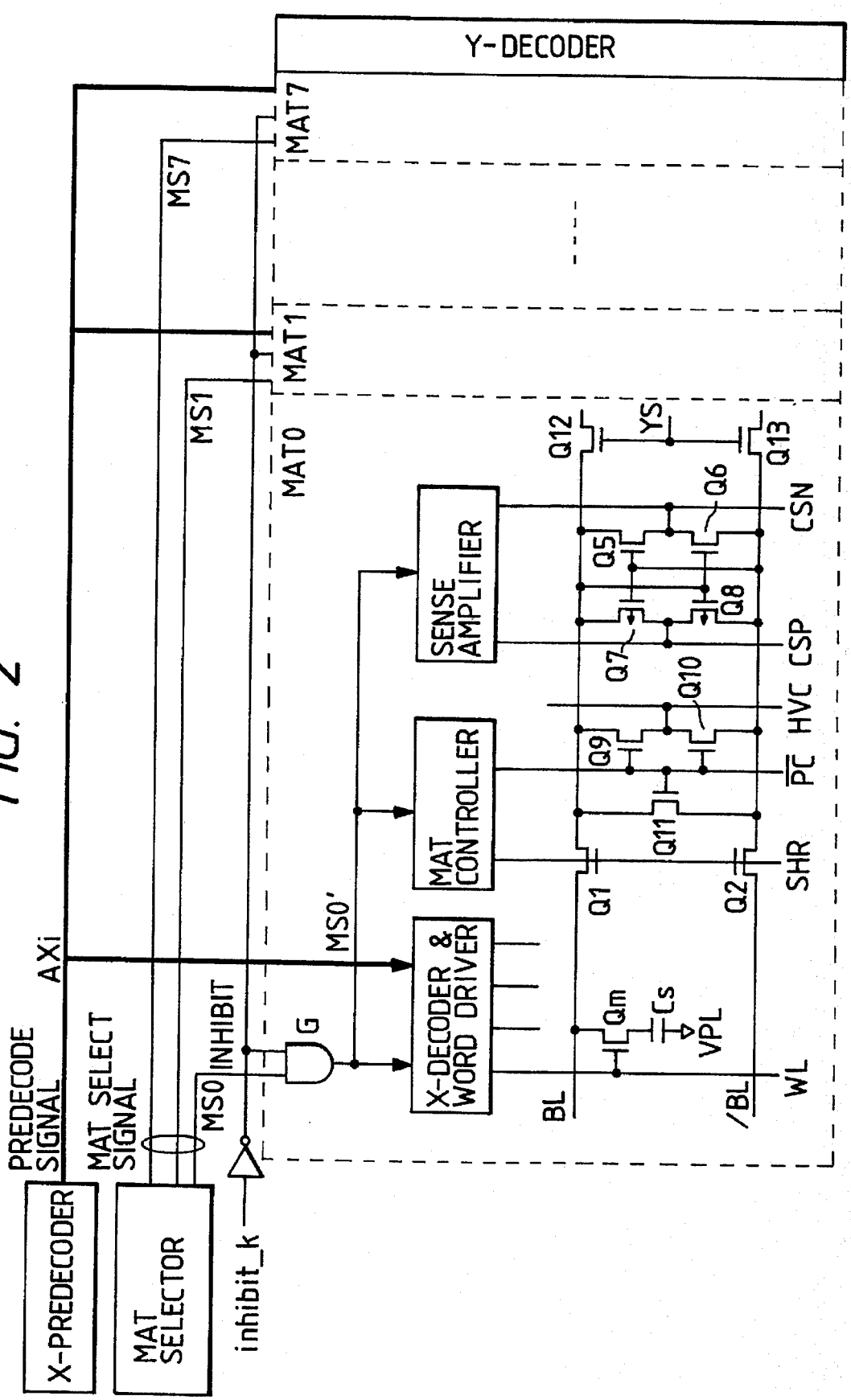
FIG. 2 is a schematic circuit diagram illustrating one of the array blocks practiced as one preferred embodiment of the invention with respect to the array block of FIG. 1.

Referring to FIG. 2, there is shown a schematic circuit diagram illustrating one preferred embodiment corresponding to one of the array blocks of FIG. 1. One array block consists of eight memory mats MAT0 through MAT7. In FIG. 2, the memory mat MAT0 is illustrated typically. As shown in the figure, an X-decoder & word driver forms a select signal for selecting one word line WL. A pair of complementary bit lines (paired bit lines) BL and /BL are arranged to cross the word line WL. The dynamic RAM is composed of a MOSFET Qm for address selection and a capacitor Cs for information storage. The gate of the address select MOSFET Qm is connected to the word line WL. One source and drain of the MOSFET Qm is connected to the bit line BL and the other source and drain is connected to one electrode of the capacitor Cs.

The paired bit lines BL and /BL are connected to a sense amplifier via shared switch MOSFETs Q1 and Q2. The sense amplifier is composed of n-channel MOSFETs Q5 and Q6, and p-channel MOSFETs Q7 and Q8, the gates and drains of which are cross connected. The drains of the n-channel MOSFET Q5 and the p-channel MOSFET Q7 are connected to the bit line BL. The drains of the n-channel MOSFET Q6 and the p-channel MOSFET Q8 are connected to the bit line /BL. The source common to the n-channel MOSFETs Q5 and Q6 is connected to a common source line CSN that extends in parallel to the word line WL. The source common to the p-channel MOSFETs Q7 and Q8 is connected to a common source line CSP that also extends in parallel to the word line WL. The common source lines CSN and CSP are supplied with a ground potential and an operating voltage such as a power voltage VCC for the circuit from a sense amplifier controller in synchronization with the operation of the sense amplifier.

The input output nodes of the sense amplifier corresponding to the paired bit lines BL and /BL are provided with a precharge circuit. The precharge circuit is composed of a short-circuit MOSFET Q11 for shorting both inputs of the sense amplifier and MOSFETs Q9 and Q10 for supplying half precharge voltage such as VCC/2 to each of the input/output nodes. The gates of the MOSFETs Q9 through Q11 are supplied with a precharge signal /PC formed by a mat controller.

The X-decoder is supplied with a predecode signal AXi from the X-predecoder. The mat selector forms mat select signals MS0 through MS7 for selecting one of the eight memory mats MAT0 through MAT7 to supply the signals to the mats respectively.

In the embodiment of FIG. 2, the refresh inhibit signal inhibit-k (k=0 to 3) formed for the array block consisting of eight memory mats MAT0 through MAT7 is inverted by an inverter to be supplied as a refresh inhibit signal INHIBIT to each of the memory mats MAT0 through MAT7. In the memory mat MAT0 typically illustrated in FIG. 2, the refresh inhibit signal INHIBIT formed by inverting the inhibit-k signal by the inverter is supplied to one input of an AND gate G. The other input of the AND gate G is supplied with the above-mentioned mat select signal MS0. An output signal MS0' of the AND gate G provides a control signal for activating the X-decoder, the mat controller, and the sense amplifier controller.

For example, when the mat selector generates the mat select signal MS0 by the refresh address signal and specifies one word line of the memory mat MAT0 by the predecode signal formed by the X-predecoder, the above-mentioned refresh inhibit signal INHIBIT formed by the inverter goes high ('1') if the above-mentioned refresh inhibit signal inhibit-k is low ('0'), thereby opening the gate of the AND gate G. Consequently, the above-mentioned control signal MS0' goes high in correspondence with the high level of the mat select signal MS0 to activate the X-decoder, the mat controller, and the sense amplifier controller, causing the X-decoder & word driver to select one word line to refresh the memory cells associated with the selected word line.

On the other hand, when the mat selector generates the mat select signal MS0 by the refresh address signal and specifies one word line of the memory mat MAT0 by the predecode signal formed by the X-decoder, if the refresh inhibit signal INHIBIT is low ('0'), the gate of the AND gate G is closed. Consequently, despite the mat select signal MS0 is high, or in the selected level, the output signal MS0' of the AND gate G remains low, leaving the X-decoder, the mat controller, and the sense amplifier in the inactive state to perform no refresh operation.

Figure 3:
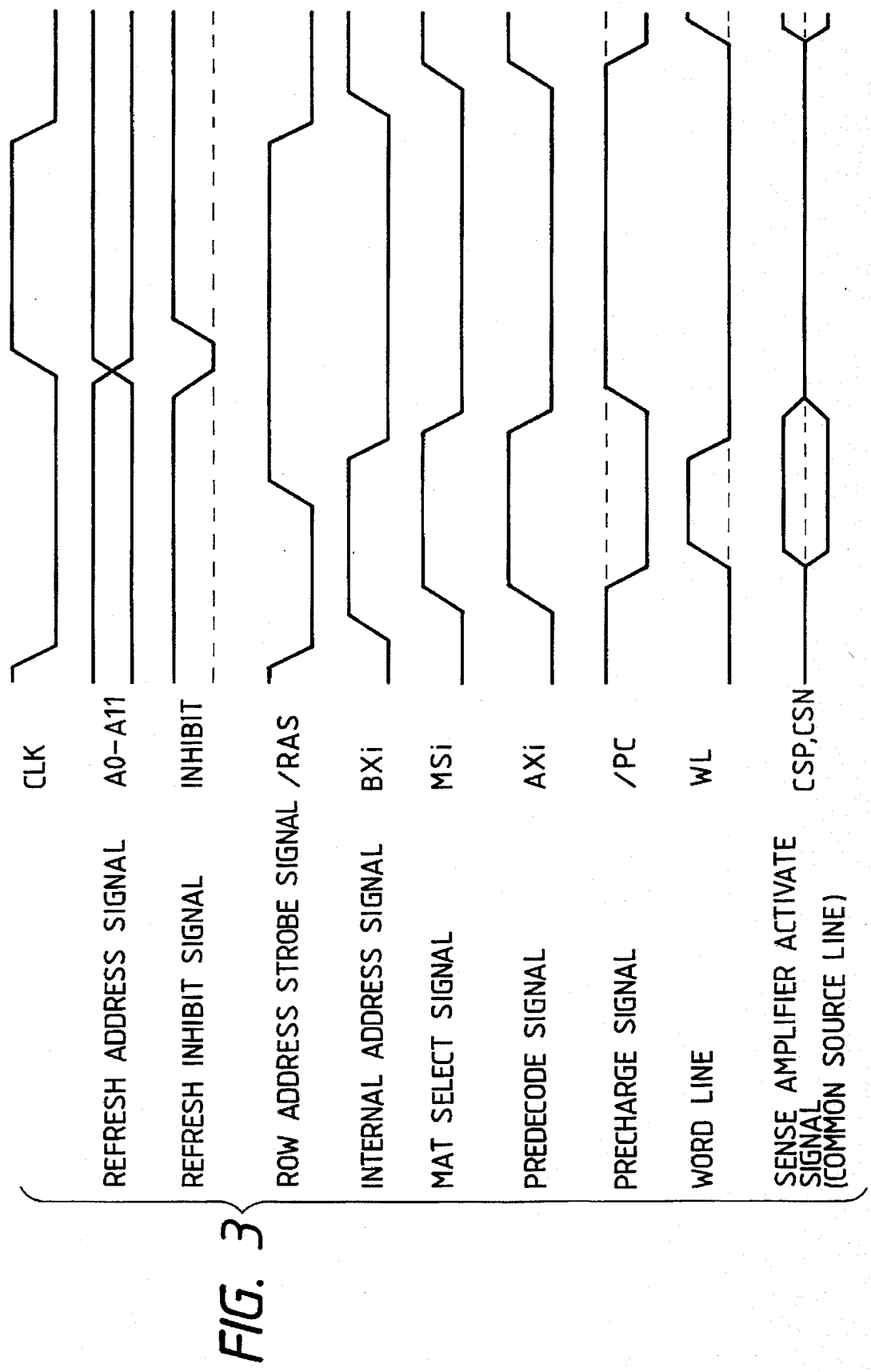
FIG. 3 is a timing chart describing an operation of the array block of FIG. 2.

Referring to FIG. 3, there is shown a timing chart for describing the operations of the array block of FIG. 2. When the clock signal CLK formed by the timer goes low, the internal row address strobe signal /RAS goes low, activating an refresh operation. It should be noted that the control signal MS0' is formed by the divide-by-m counter of FIG. 1, the gate that receives the output signal /T2 from the divide-by-m counter, the inverter of FIG. 2 that receives the refresh inhibit signal inhibit-k, and the AND gate G of FIG. 2. If the refresh inhibit signal INHIBIT is high as indicated with a solid line, an internal address signal BXi is formed in correspondence with the refresh address signals A0 through A11. And the mat select signal MSi and the predecode signal AXi are formed by decoding the internal address signal BXi. Then, in the selected memory mat, the precharge signal /PC goes low, halting the precharge operation. Subsequently, the word line WL is put in the selected level, the sense amplifier operating signal CSN is made low, and the CSP is made high to cause the sense amplifier to begin an amplifying operation, thereby amplifying the information stored in the memory cells connected to the word line to rewrite the information, upon which the refresh operation is completed.

If the refresh inhibit signal INHIBIT is low as indicated with a dotted line, the internal address signal BXi is formed in correspondence with the refresh address signal A0 through A11 and the mat select signal MSi and the predecode signal AXi are formed by decoding the internal address signal BXi but the formed mat select signal MSi is not supplied to the corresponding mat MATi. As a result, the precharge signal /PC remains high maintaining the precharge operation and the word line WL is fixed to low level, or the deselected state, and the sense amplifier signals CSN and CSP are both kept at the half precharge voltage.

When the clock signal CLOCK goes from low to high, the refresh address signals A0 are A11 to be used for the following refresh operation are incremented. In corresponding with the increment, a read operation is performed on the PROM array, upon which the refresh inhibit signal INHIBIT is outputted before the next refresh operation. When the clock signal goes from high to low, the signal /RAS goes low to determine whether to inhibit the refresh operation in correspondence with the refresh inhibit signal INHIBIT.

Figure 4:
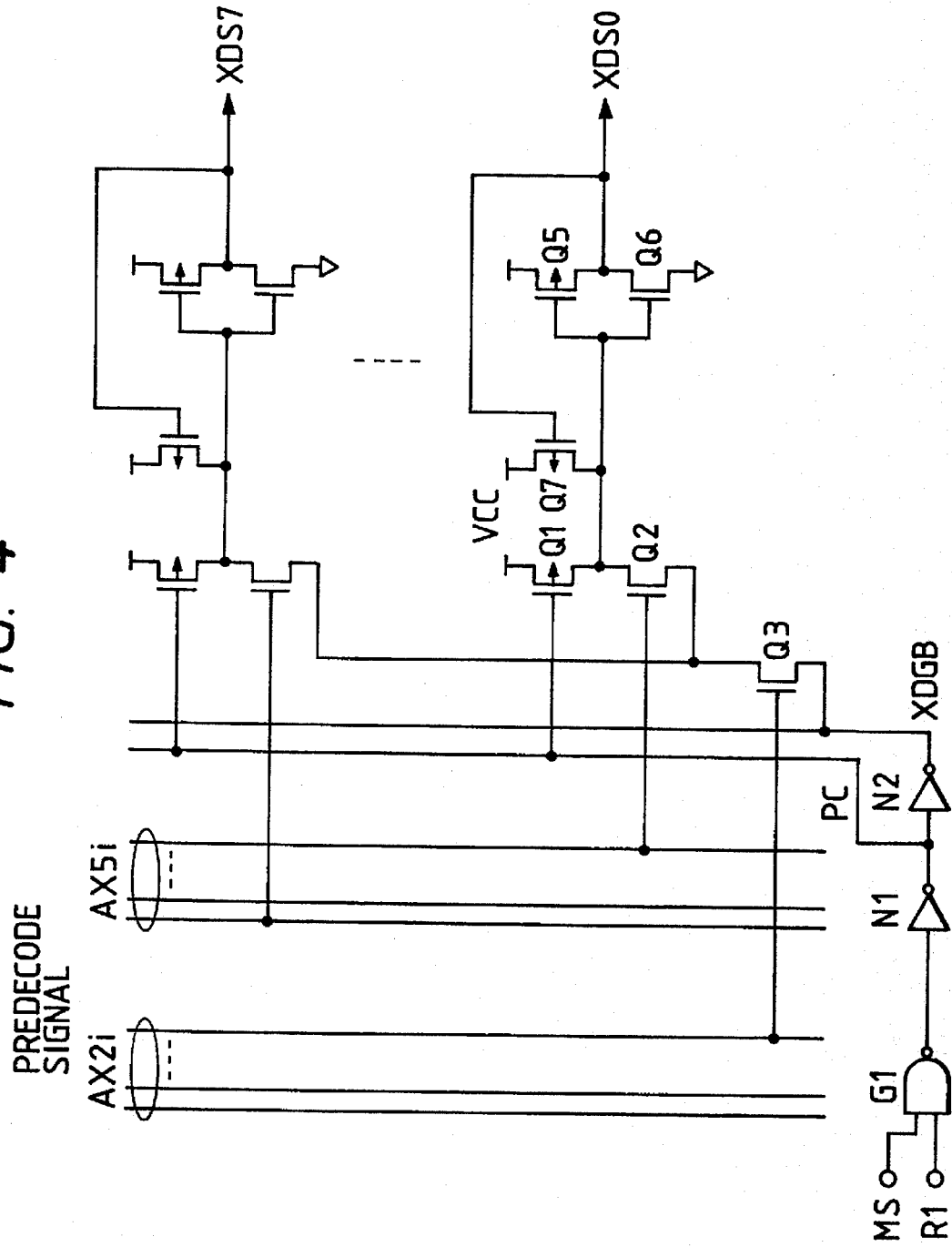
FIG. 4 is a circuit diagram illustrating an X-decoder provided in a memory mat of FIG. 2, practiced as one preferred embodiment of the invention.

Referring to FIG. 4, there is shown a circuit diagram of one embodiment of the X-decoder provided for the above-mentioned memory mat. In the figure, eight word driver selectors are illustrated typically. A word driver select signal XDS0 is formed by a CMOS inverter composed of a p-channel MOSFET Q5 and an n-channel MOSFET Q6. The input of this CMOS inverter is provided with a decoder. The decoder is composed of p-channel recharge MOSFET Q1, an n-channel MOSFET Q2 supplied with a predecode signal at its gate, and an n-channel MOSFET Q3 provided in series with the MOSFET Q2. The gate of the MOSFET Q3 is supplied with a predecode signal AX2i, which is shared by the similar n-channel MOSFETs of the rest of seven word driver selectors.

The source of the n-channel MOSFET Q3 is supplied with a discharge signal XDGB. The discharge signal XDGB is formed from a mat select signal MS and a row timing signal R1 that pass a NAND gate G1, an inverter N1, and an inverter N2 in this order. The output of the inverter N1 is supplied as the precharge signal PC to the gate of the p-channel precharge MOSFET Q1. In the embodiment of FIG. 2, the mat select signal MS corresponds to the control signal MS0' formed by the AND gate G of FIG. 2.

The embodied circuit of FIG. 4 operates as follows. When the mat select signal MS or the timing signal R1 is low, the precharge signal PC goes low to turn on the p-channel precharge MOSFET Q1 and others, thereby performing a precharge operation. This causes the input level of the CMOS inverter constituting each word driver selector to go high, so that each of the word driver select signals XDS0 through XDS7 is held low, or in the deselected state. When the above-mentioned precharge signal PC is low, the discharge signal XDGB is high. Therefore, even if the MOS- FETs Q2 and Q3 have been put in the on state by the precharge MOSFET Q1 in the on state and predecode signals AX2i and AX5i, no direct current flows, thereby securing the above-mentioned precharge voltage.

When the mat select signal MS and the timing signal R1 go high, the precharge signal PC also goes high, turning off the precharge MOSFET Q1 and others. As a result, the discharge signal XDGB goes from high to low, so that a discharge path is formed in one word driver selector specified by the predecode signals AX1i and AX5i, which is made low. This makes the word driver select signal XDS7 for example go from low to high, or into the selected state.

At this moment, in the other word driver selectors, a feedback p-channel MOSFET Q7 provided between the input side and the power voltage VCC is turned on by the low-level deselect signal, performing a latch operation in which the input level of the Q7 being fixed to the power voltage VCC. Namely, in the other deselected word driver selectors, the deselected word drivers are prevented from being erroneously selected by a precharge voltage drop caused by a leak current.

In the present embodied circuit, keeping the mat select signal MS low by the refresh inhibit signal INHIBIT as mentioned above causes the decoder to perform the precharge operation with the precharge signal PC being kept low even if the timing signal R1 and the predecode signals AX2i and AX5i have been generated. This precharge operation prevents the generation of the word driver select signal, thereby inhibiting a word line select operation.

Figure 5:
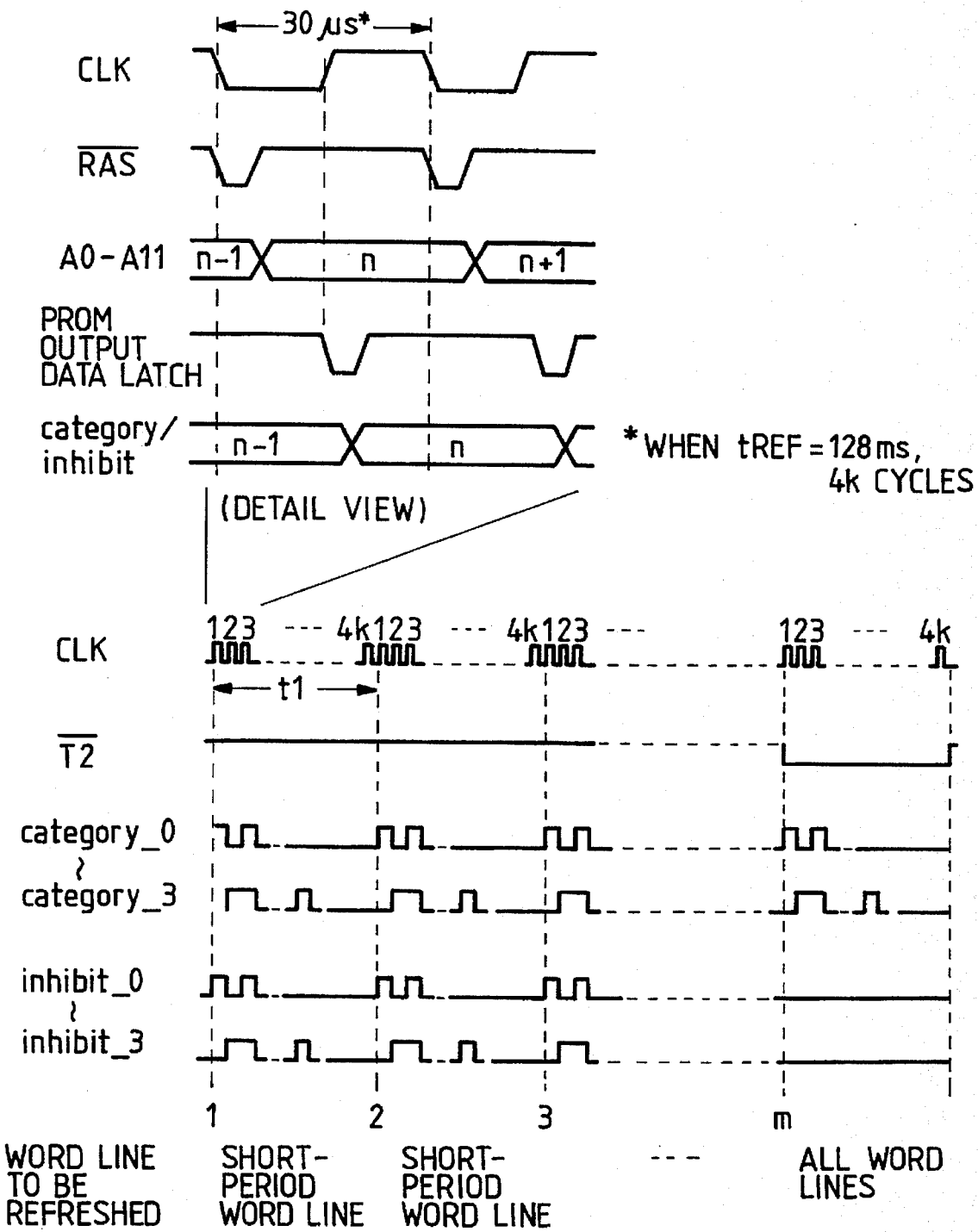
FIG. 5 is a timing chart describing an adaptive refresh operation in the dynamic RAM associated with the invention.

Referring to FIG. 5, there is shown a timing chart for describing an adaptive refresh operation in the dynamic RAM associated with the present invention. The word line corresponding to short period synchronizes with the clock signal CLK formed by the timer as described before to perform a refresh operation once in a time t1 corresponding to one rotation of the address counter. In the case of the word line corresponding to short period, the refresh operation is performed once in m times (/T2). Thus, the refresh operation is performed for substantially all word lines.

In details, in the refresh operation, when the clock signal CLK goes low, the /RAS signal is made low. Because the divided pulse /T2 is high, the word line at n-1 address specified by the address signals A0 through A11 is selected when the refresh inhibit signal inhibit goes low at the time the refresh time setting information (category) coming from the data latch of the PROM goes low, performing the refresh operation on the memory cells connected to the selected word line. If the refresh time setting information (category) is high, the signal inhibit is also made high, so that the word line at the n-1 address specified by the address signals A0 through A11 is inhibited from refreshing the memory cells.

The refresh address counter is incremented by one in synchronization with the change in the level of the signal /RAS from low to high, updating the refresh address to address n, but not limited thereto. Then, a PROM read operation is performed by the refresh address n in synchronization with the change in the level of the clock signal CLK from low to high, reading the refresh time setting information prior to the refresh operation.

In the present embodiment, the memory cell having the shortest information retention time of the memory cells of about 4K bits each on which the refresh operation is performed in each memory mat is stored as of short period if the information retention time is shorter than m times the clock signal CLK or stored as of long period if the information retention time is longer than m times the clock signal CLK.

At this moment, the state in which the PROM has not been written represents the short-period information (for example, '0') and the state in which the PROM has been written represents the long-period information (for example, '1') for enhanced reliability.

If the above-mentioned PROM is constituted by EPROM cells to be described later, the data retaining operation itself of the DRAM is not be adversely affected and high reliability is guaranteed. This is because, even if information written as '1' is erroneously read as '0' due to insufficient writing or data volatilization, the memory cells to be refreshed in long period are merely refreshed in short period.

Figure 6:
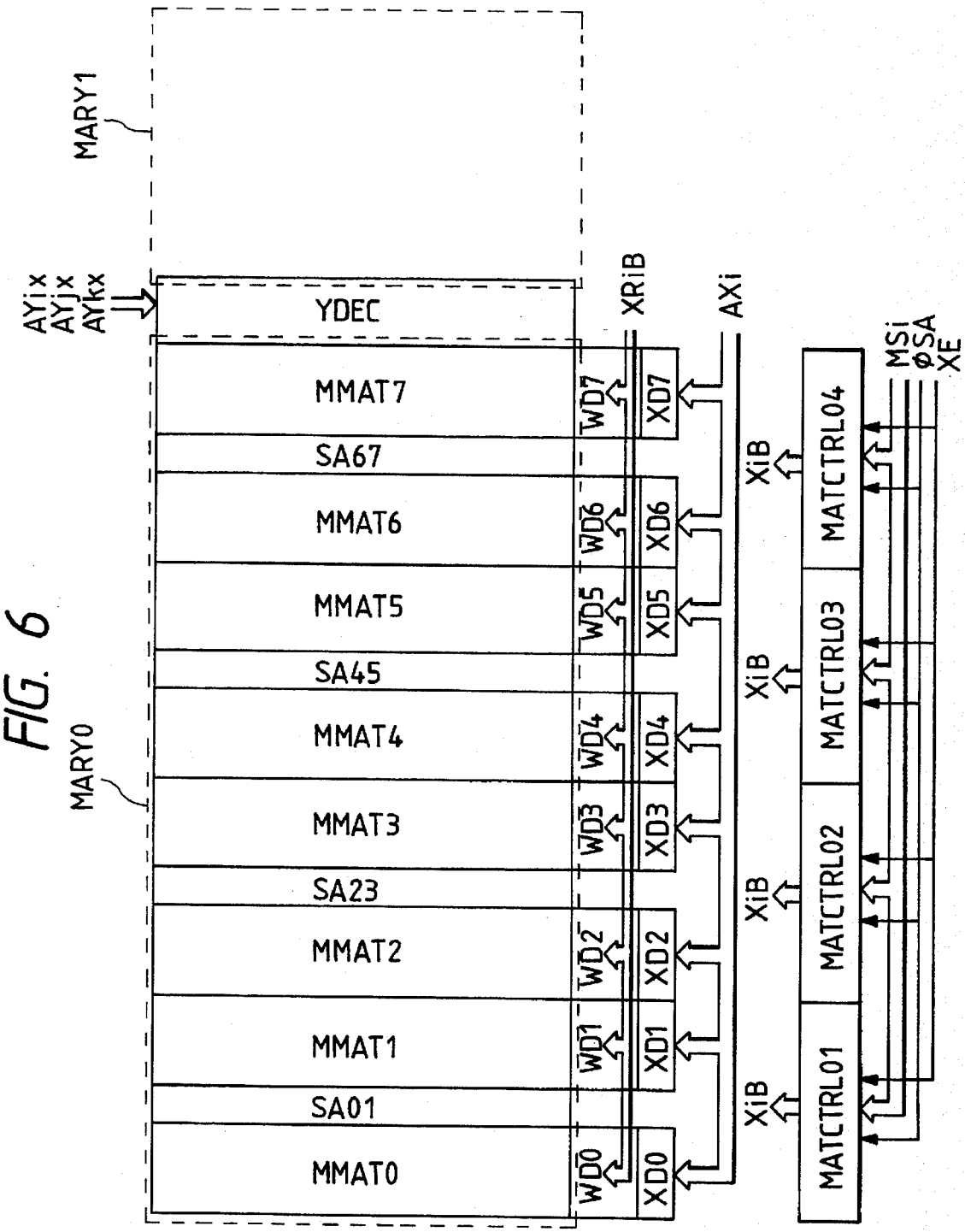
FIG. 6 is a block diagram illustrating a memory array and its peripheral circuits indicating one preferred embodiment of the dynamic RAM to which the present invention is applied.
Figure 7:
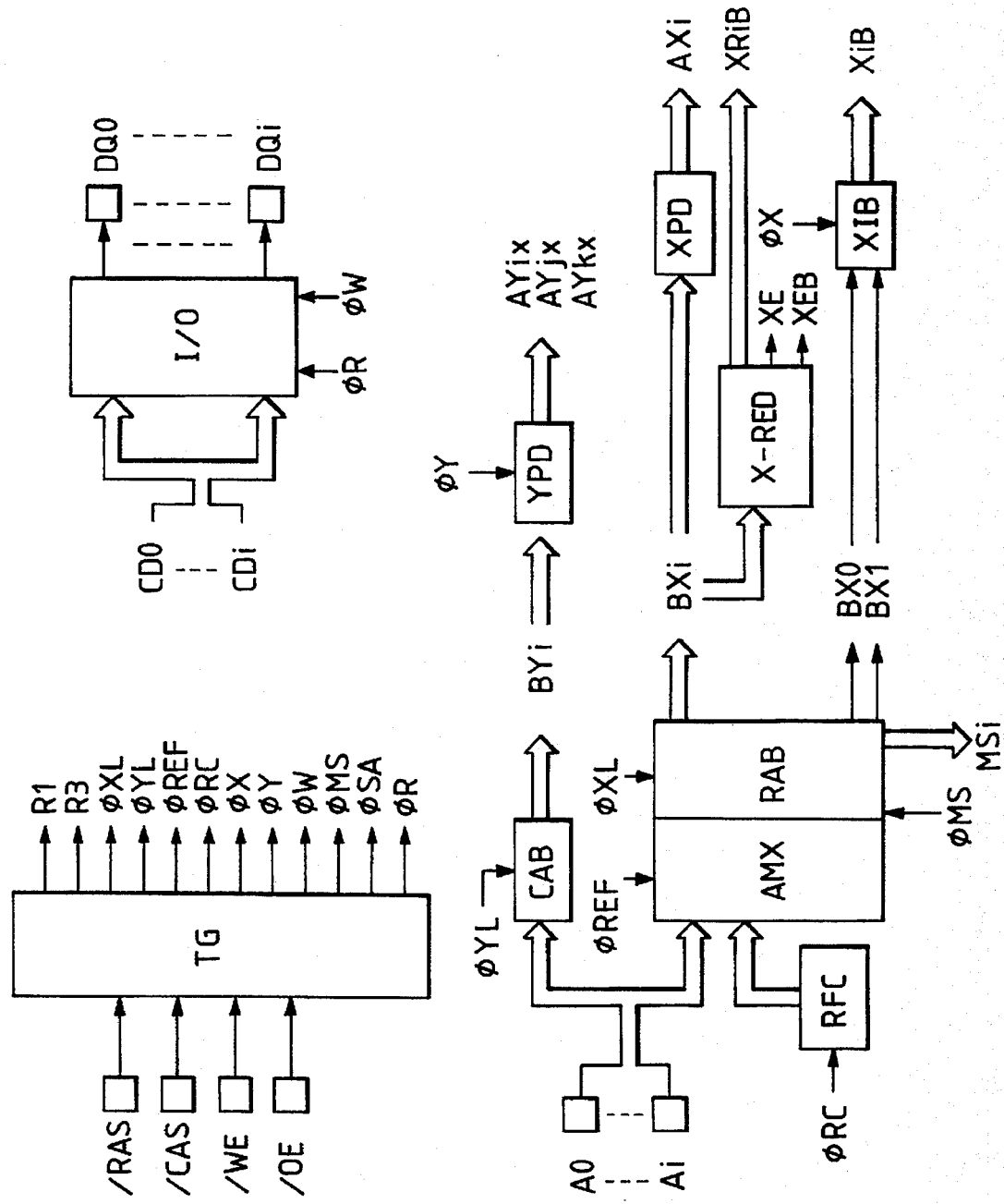
FIG. 7 is a block diagram illustrating an input/output interface and a controller indicating one preferred embodiment of the dynamic RAM to which the present invention is applied.
Figure 8:
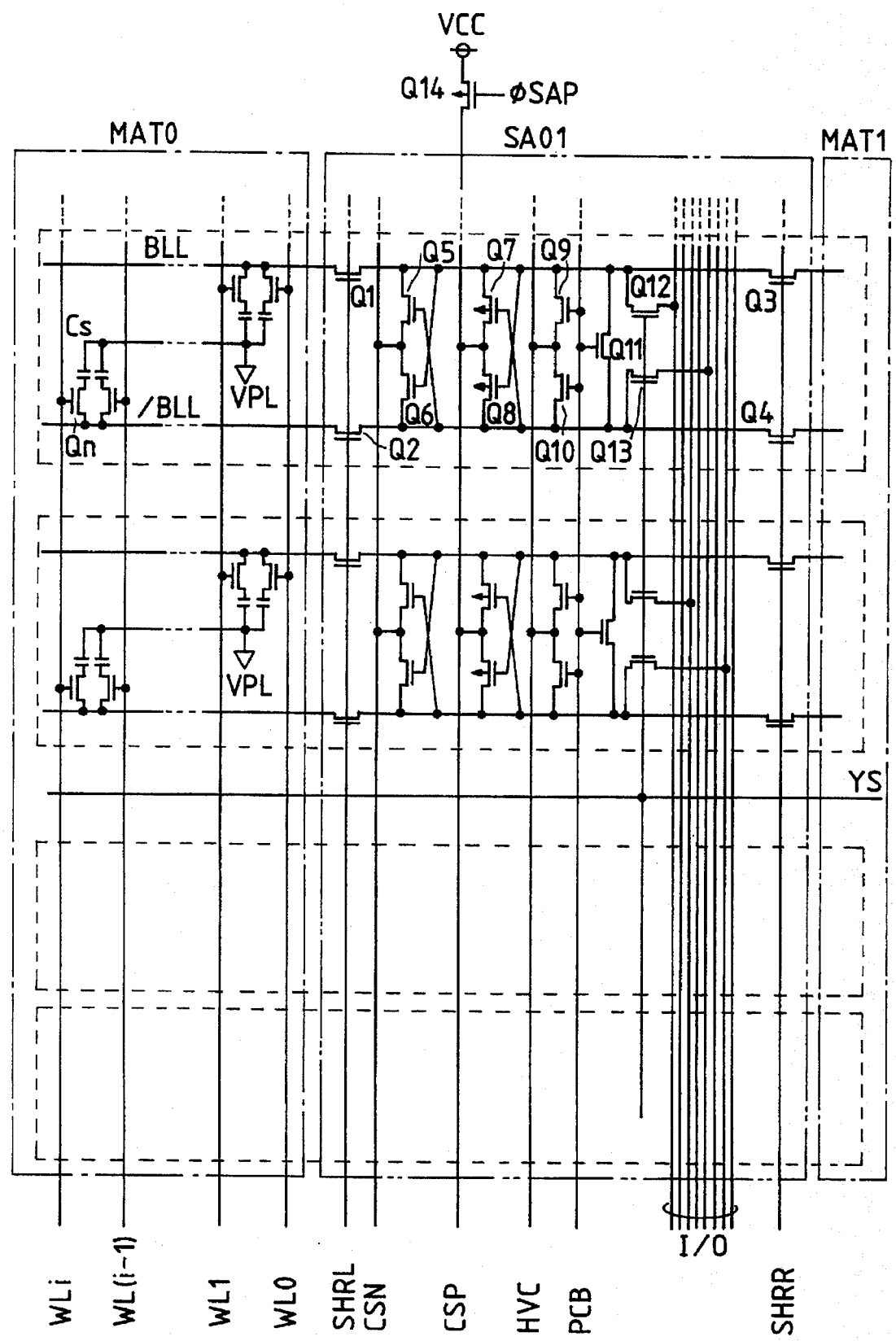
FIG. 8 is a circuit diagram illustrating main portion of one preferred embodiment of an memory array of the dynamic RAM associated with the invention.

Referring to FIGS. 6 and 7, there are shown block diagrams of one embodiment of the dynamic RAM to which the present invention is applied. FIG. 6 shows a memory array its peripheral selectors. Referring to FIG. 8, there is shown a block diagram illustrating an input/output interface portions such as an address buffer and an input/output buffer, and a timing controller.

In FIG. 6, a sense amplifier SA01 is provided between two memory mats MAT0 and MAT1. Namely, the sense amplifier SA01 serves as a shared sense amplifier to be selectively used by the memory mats MAT0 and MAT1. An input/output portion of the sense amplifier SA01 is provided with a selector switch, not shown, which is connected to paired bit lines (or paired data lines or paired digit lines) of the memory mat MAT0 or MAT1.

The other memory mats are also paired; namely MAT2 and MAT3, MAT4 and MAT5, and MAT6 and MAT7, with sense amplifiers SA23, SA45 and SA67 provided between the memory mats of the pairs respectively. The eight memory mats MAT0 through MAT7 and the four sense amplifiers SA01 through SA67 make up one memory array MARY0. For the memory array MARY0, a Y-decoder YDEC is provided. On the other side of the YDEC, a memory array MARY1 is provided in symmetry with the MARY0. The memory array MARY1 has generally the same constitution as that of the memory array MARY0.

For the memory mats MAT0 through MAT7, decoders XD0 through XD7 are provided respectively. The decoders XD0 through XD7 decode the output signal AXi coming from the predecoder XPD to form word line select signals each for selecting four word lines. The decoders XD0 through XD7 and output signals of mat controllers MAT-CRL01 through MATCTRL67 to be described later provide word drivers WD0 through WD7 for forming the word line select signals. These word drivers include a word driver for a reserved word line to be used for defect remedy.

For the pair of memory mats MAT0 and MAT1, the mat controller MATCTRL01 is provided. For the other pairs of memory mats MAT2 and MAT3, MAT4 and MAT5, and MAT6 and MAT7, the mat controllers MATCTRL23, MATCTRL45, and MATCTRL67 are provided respectively. Each of the mat controllers MATCTRL01 through MATC-TRL67 receives a mat select signal MSi, a signal XE, a sense operation timing signal φSA, and a signal obtained by decoding an address signal of lower-order two bits to generate a select signal XiB for selecting one of the four word lines in the corresponding memory mat.

In addition, each of the mat controllers MATCTRL01 through MATCTRL67 generates a select signal for turning off a bit line select switch corresponding to a deselected memory mat with a bit line select switch corresponding to either left or right memory mat corresponding to the selected memory mat kept on and a timing signal for starting a sense amplifier operation. Further, each of the mat controllers provides a capability of controlling, in the standby state of refresh operation, one of both of the sense amplifier and the bit line select switch to float the bit line.

When a defective word line is accessed, the signal XE goes low to inhibit the output of the above-mentioned select signal XiB, thereby stopping the operation of selecting the defective word line. Instead of the select signal XiB, a select signal XRiB of a redundant circuit is formed, putting the reserved word line in the selected state.

In FIG. 7, a timing controller TG receives the row address strobe signal /RAS, a column address strobe signal /CAS, a write enable signal /WE, and an output enable signal /OE, all supplied from external terminals, determines an operating mode and accordingly forms various timing signals necessary for operations of internal circuits. It should be noted that a slash "/" used herein and in the drawings accompanying hereto indicates that each signal that follows the slash is an active low signal.

Signals R1 and R3 are row internal timing signals to be used for selecting a row as will be described. A timing signal φXL is used for capturing a row address to hold it in a latch circuit and is supplied to a row address buffer RAB. Namely, the row address buffer RAB captures an address entered from address terminals A0 through Ai by the timing signal φXL to hold the captured address in the latch circuit.

A timing signal φYL is used to capture a column address to hold it in a latch circuit and supplied to a column address buffer CAB. Namely, the column address buffer CAB captures an address entered from the address terminals A0 through Ai by the timing signal φYL to hold the captured address in the latch circuit.

A signal φREF is generated in a refresh mode and supplied to a multiplexer AMX provided in the input portion of the row address buffer RAB. In the refresh mode, the signal φREF makes control such that a refresh address signal formed by a refresh address counter RFC is used. The refresh address counter RFC counts an incrementing pulse (the clock signal CLK) for refresh formed by a timer circuit contained in the timing controller TG to generate a refresh address signal. In the present embodiment, the refresh address counter RFC provides both auto refresh and self refresh capabilities.

A timing signal φX is a word line select timing signal and supplied to a decoder XIB to form four word line select timing signals based on a signal obtained by decoding an address signal or lower-order two bits. A timing signal φY is a column select timing signal and supplied to the column predecoder YPD to output column select signals AYix, AYjx, and AYkx.

A timing signal φW is a control signal for instructing a write operation. A timing signal φR is a control signal for instructing a read operation. These timing signals φW and φR are supplied to an input/output circuit I/O to activate an input buffer included in the I/O and put an output buffer included in the I/O in a high-impedance state in the write operation. In the read operation, these timing signals activate the output buffer and put the input buffer in the high-impedance state.

A timing signal φMS is a signal for instructing a mat select operation and supplied to the row address buffer RAB from which mat select signal MSi is outputted in synchronization with this timing. A timing signal φSA is a signal for instructing a sense amplifier operation. Based on this timing signal φSA, a sense amplifier activating pulse is formed. The timing signal φSA is also used to form control signals for controlling an operation of ending bit line precharge and separating a bit line on the side of a deselected memory mat.

In the present embodiment, a row redundant circuit X-RED is typically illustrated. The circuit X-RED includes a memory circuit for storing a defective address and an address comparator. The comparator compares the stored defective address with an internal address signal BXi outputted from the row address buffer RAB. If a mismatch is found, a signal XE is made high and a signal XEB is made low to make valid the operation of a normal circuit. If a match is found, the signal XE is made low to inhibit the selection of the defective word line of the normal circuit and the signal XEG is made high to output a select signal XRiB for selecting one reserved word line.

Although not shown in FIG. 7, generally the same circuits as the above-mentioned row circuits are provided in the column system. When memory access to a defective bit line is detected by the columns circuits, a column decoder YD is prevented from selecting the defective bit and a select signal for selecting a reserved bit line is formed instead.

Referring to FIG. 8, there is shown a circuit diagram illustrating a main portion of a memory array of the dynamic RAM associated with the present invention. FIG. 8 typically illustrates four word lines, two pairs of bit lines, and associated sense amplifier and precharge circuit of the memory mat MAT0. The memory mat MAT1 is illustrated as a so-called black box. Circuit symbols are typically added to a MOSFET constituting each circuit corresponding to the paired bit lines BLL and /BLL.

The dynamic memory cell is composed of a MOSFET Qm for address selection and a capacitor Cs for information storage. The gate of the MOSFET Qm is connected to a word line WLi, the drain thereof is connected to the bit line /BL, and the source thereof is connected to the capacitor Cs. The other electrode of the capacitor Cs is commonly supplied with a plate voltage VPL.

The paired bit lines BLL and /BLL are arranged in parallel to each other as shown in FIG. 8 and are crossed as required to balance bit line capacitance. The paired bit lines BLL and /BLL thus arranged are connected to the input/output nodes of a sense amplifier via switch MOSFETs Q1 and Q2. The sense amplifier is composed of n-channel MOSFETs Q5 and Q6 connected in a latch form with gate and drain connected in cross and p-channel MOSFETs Q7 and Q8 connected in a latch form with gate and drain connected in cross. The sources of the n-channel MOSFETs Q5 and Q6 are connected to the common source line CSN.

The sources of the p-channel MOSFETs Q7 and Q8 are connected to the common source line CSP. As typically indicated by the common source line CSP, a p-channel power switch MOSFET Q14 is provided to supply a voltage necessary for a sense amplifier operation when a timing signal φSAP is made low to turn on the MOSFET Q14. The common source line CSN corresponding to the n-channel MOSFETs Q5 and Q6 is provided with an n-channel MOSFET, not shown, to supply ground to a line operation timing circuit.

For a stable sense operation, the power switch MOSFET for activating the sense amplifiers and supplying only a relatively small current at beginning of sense amplifier operation is turned on and flows a relatively large current when a potential between the paired bit lines BLL and /BLL is increased to a certain degree by the sense amplifier operation. Thus the amplifying operation is performed in steps.

The input/output nodes are provided with a MOSFET Q11 for short-circuiting the paired bit lines and a precharge circuit composed of switches MOSFETs Q9 and Q10 for supplying a half precharge voltage HVC to the paired bit lines. The gates of these MOSFETs Q9 through Q11 are commonly supplied with a precharge signal PCB. MOSFETs Q12 and Q13 constitute a column switch to be controlled by a column select signal YS. In the present embodiment, one column signal selects four pairs of bit lines. Therefore, the column select signal YS is commonly supplied to the gates of MOSFETs constituting column switches provided on the input/output nodes of four sense amplifiers corresponding to the two pairs of bit lines illustratively shown in FIG. 8 and the remaining two pairs of bit lines, not shown. Through these switch MOSFETs, the four pairs of bit lines are connected to the four pairs of input/output lines I/O.

Figure 9:
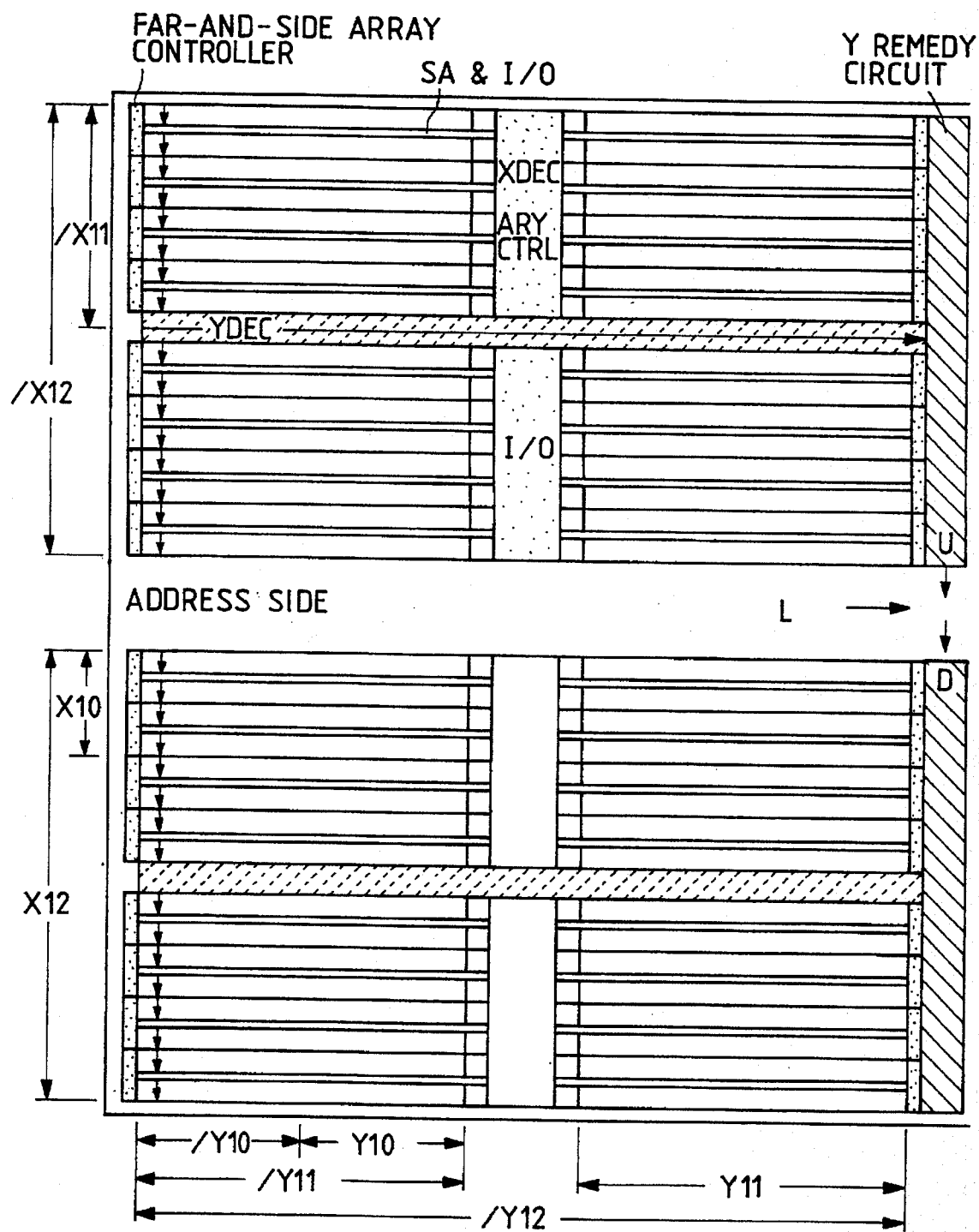
FIG. 9 is a layout diagram illustrating a part of the memory array indicating one preferred embodiment of the dynamic RAM to which the present invention is applied.
Figure 10:
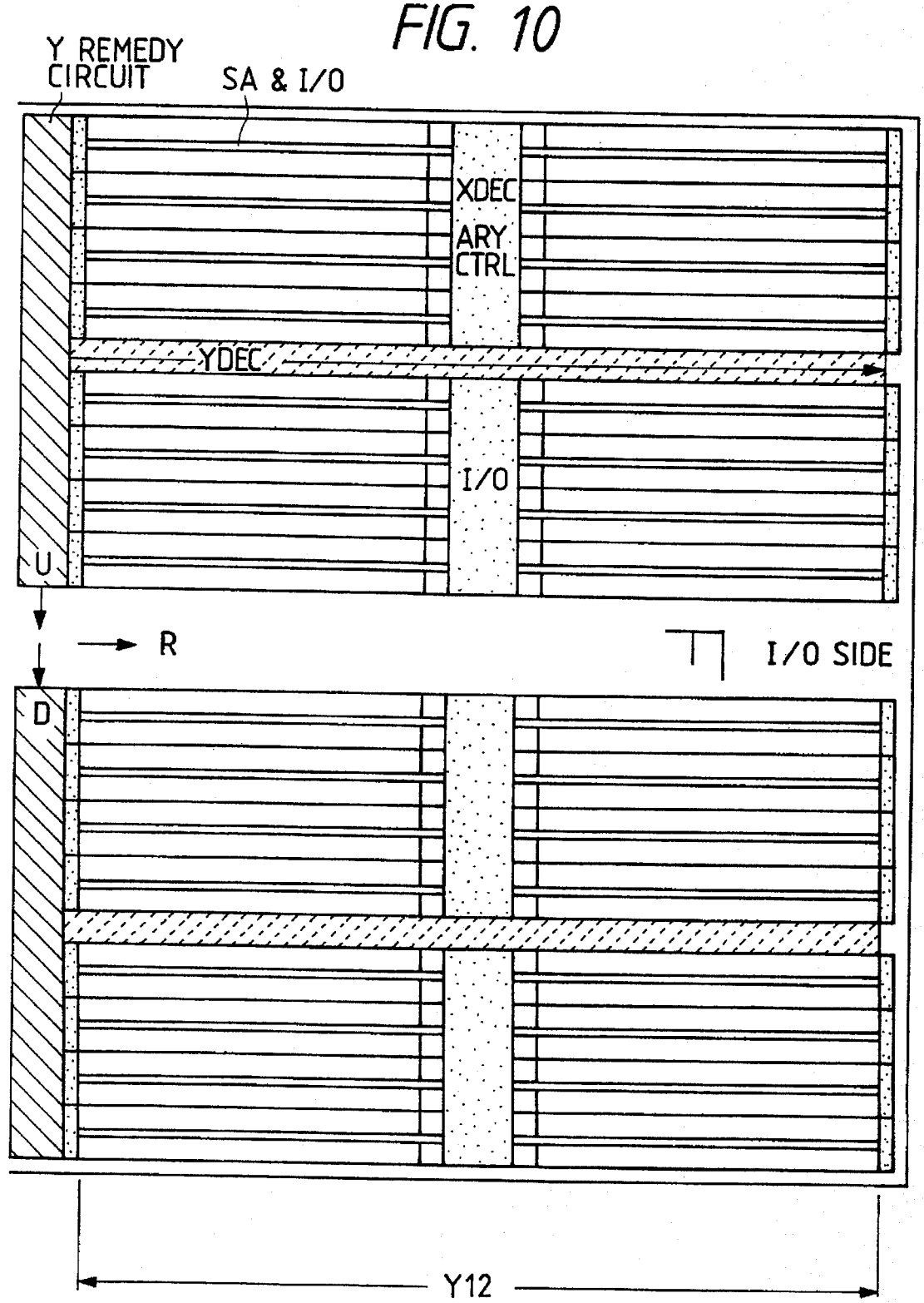
FIG. 10 is a layout diagram illustrating a remaining part of the memory array indicating one preferred embodiment of the dynamic RAM to which the present invention is applied.

Referring to FIGS. 9 and 10, there are shown layouts of memory arrays of the dynamic RAM practiced as one preferred embodiment of the present invention. The dynamic RAM of the present embodiment has a storage capacity of about 64M bits for example as described before. FIGS. 9 and 10 show the left half (L) and the right half (R) of a chip respectively, the chip being wide rather than tall. A Y remedy circuit is vertically provided at the center of the chip and commonly shown in both layouts.

A sense amplifier and an input/output line (SA & I/O) are provided between two memory mats. For address assignment, most significant bits /X12 and X12 are assigned to the upper side U and the lower side D respectively. The memory mats are divided around the above-mentioned Y-decoder YDEC into two groups each consisting of eight memory mats. The two groups are assigned with address signals /X11 and X11 respectively. In the figure, an address X10 assigned to four memory mats on the lower side D is typically illustrated. Although not shown in the figure, /X9 and X9 are assigned to one group of two memory mats and the other group two memory mats respectively, with the sense amplifier between the two groups. /X8 and X8 are assigned to the two memory mats respectively, with the sense amplifier between the memory mats.

A row decoder XDEC, an array controller ARYCTRL, and a mat input/output line I/O provided in the vertical (up and down) direction of the chip are composed of the word driver WD, the decoder XD, and the mat controller MATCTRL of FIG. 6, and input/output lines outside the mat. At the center along the length of the chip, input/output interface circuits such as input buffers and output buffer of the address side and the I/O side.

An arrow attached to each memory mat indicates the direction of address. Namely, the memory mats are refreshed from up to down sequentially in FIG. 9. Attempting a refresh operation in the arrow direction sequentially requires 8192 cycles, thereby restricting the memory access. To solve this problem, the memory blocks to be specified the address X12 are divided into four array blocks for example such that the memory block are selected simultaneously. The refresh inhibit signal is assigned to each word line and the entire refresh operation is made to be completed in 4096 (about 4K) cycles. Namely, when the address X12 is made invalid, the array blocks 0 and 1 of FIG. 1 correspond to the upper side U and the lower side D of the left side (L) of the chip in FIG. 9, while the array blocks 2 and 3 correspond to the upper side U and the lower side D of the right side (R) of the chip in FIG. 10.

For column address assignment, the left side and the right side around the Y remedy circuit are assigned with most significant bits of Y address, /Y12 and Y12 respectively. The memory mats divided by the X-decoder XDEC to the left and right sides are assigned with address signals /Y11 and Y11 respectively. /Y10 and Y10 are assigned to each of the memory mats. As described before, four pairs of bit lines are selected simultaneously in memory, so that, to finally select any one of them, Y9 and Y8 or least significant two bits Y0 and Y1 are used. Thus, address assignment of about 8K is performed in the Y direction as a whole corresponding to the X direction.

Figure 11:
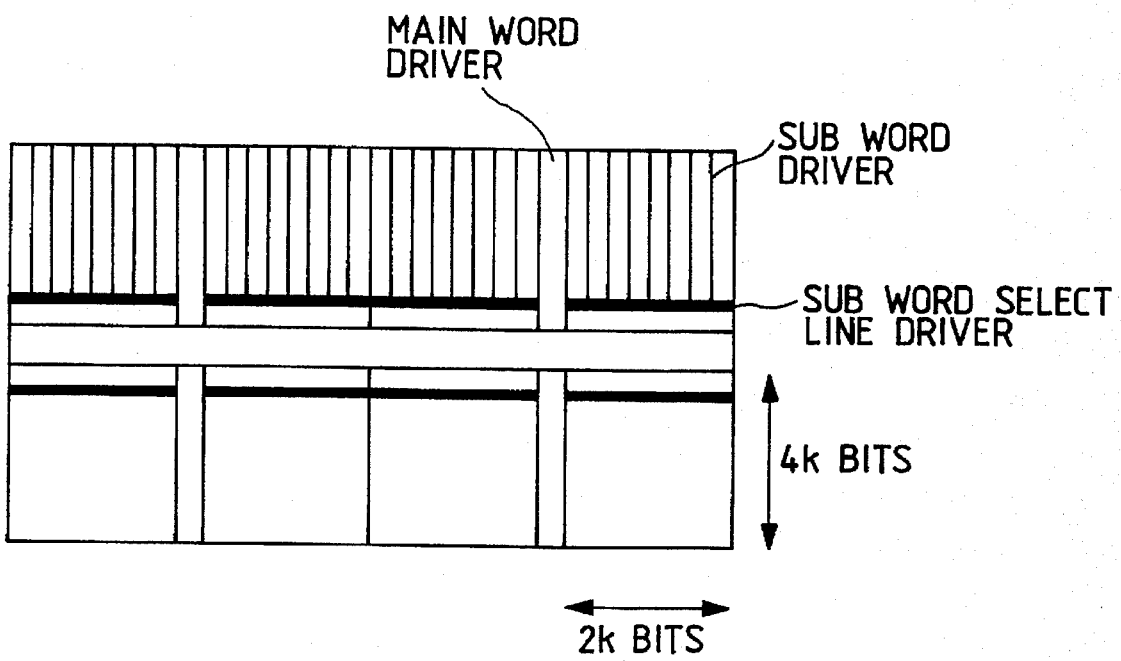
FIG. 11 is a schematic layout diagram illustrating another preferred embodiment of the dynamic RAM associated with the invention.

Referring to FIG. 11, there is shown a schematic layout of the dynamic RAM practiced as another preferred embodiment of the present invention. The dynamic RAM of this embodiment has a storage capacity of about 64M bits, but not limited thereto, like the preceding embodiment. The present embodiment has eight memory arrays as a whole. The memory arrays are divided into two groups of four memory mats along the length of the semiconductor chip. Between the two groups of four, there are provided input/output interface circuits such as address input circuit and data input/output circuits.

The memory arrays divided into the two groups along the length of the semiconductor chip are arranged in pairs of two also along the length of the semiconductor chip. A main word driver is provided for the memory arrays of each pair and arranged between them. This main word driver is also provided for the memory arrays of the pair below the former pair. The main word driver forms a select signal for selecting a main word line passing through each of the memory arrays. Each memory array is constituted by dynamic memory cells having storage capacities of 2K bits along the main word line and 4K bits along paired bit lines (or paired data lines), not shown, orthogonally crossing the main word line. The eight of such memory arrays are arranged as a whole, providing a storage capacity as large as 64K bits (8×2K bits×4K bits).

Each of the eight memory arrays is divided into eight blocks relative to the main word line. Each of the resultant eight memory blocks is provided with a sub word driver. The sub word driver is divided in length into ⅛ of the main word line to form a select signal for selecting a sub word line running in parallel thereto. In the present embodiment, to decrease the number of main word lines, or to make thinner the density of the wiring of the main word lines, four sub word lines, but not limited thereto, are arranged for one main word line in the direction of paired bit lines. A sub word select line driver is arranged to select one of the sub word lines which are divided into eight to be allocated in units of four in the direction of paired bit lines. This sub word select line driver forms a select signal for selecting one of the four sub word select lines running in the direction in which the above-mentioned sub word drivers are arranged.

When one memory array is taken up for example, one sub word line is selected by the sub word driver corresponding to one of the eight memory blocks assigned to one main word line, the one including a memory cell to be selected, so that one sub word line is selected from among 32 (8×4) sub word lines belonging to one main word line. Since memory cells of 2K (2048) bits are arranged in the direction of main word line as described before, 256 (2048/8) memory cells are connected to one sub word line.

Figure 12:
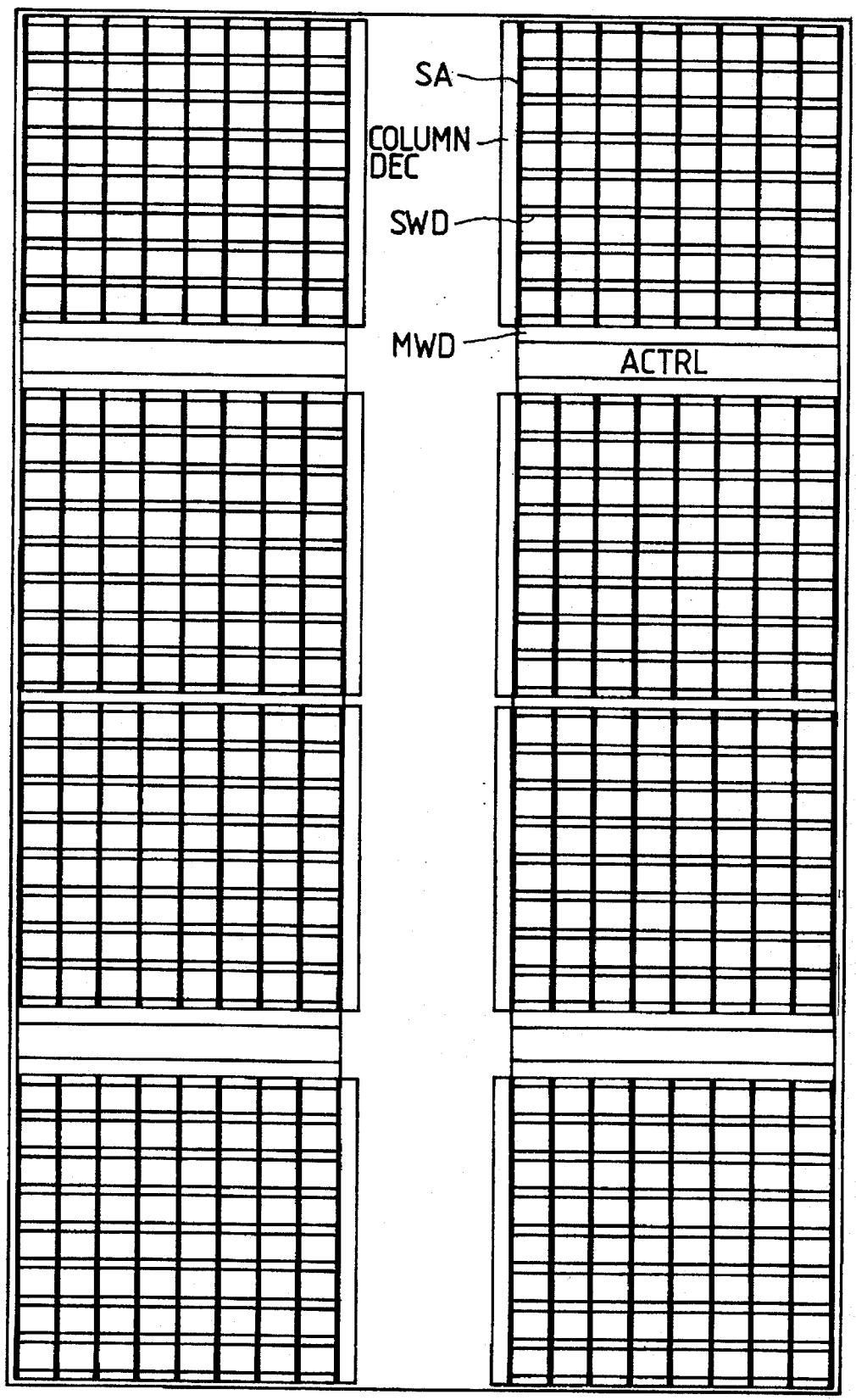
FIG. 12 is a layout diagram illustrating one preferred embodiment of the dynamic RAM of FIG. 11.

Referring to FIG. 12, there is shown a layout illustrating the above-mentioned preferred embodiment of the dynamic RAM. In the figure, the arrangement of important circuits of the column system including the sense amplifier SA and the column decoder is shown for ease of understanding the dynamic RAM associated with the present invention. In the figure, MWD denotes the main word driver, SWD denotes the sub word driver, SA denotes the sense amplifier, and Column Dec denotes the column decoder. ACTRL denotes the array controller arranged between two memory arrays to supply timing signals necessary for the operations of the address decoder and other circuits.

As described before, one memory array has a storage capacity of 4K bits in the direction of paired bit lines. However, if memory cells having a storage capacity as large as 4K bits are connected to one pair of bit lines, the parasitic capacitance of the paired bit lines increases too much to obtain a signal level that can be read by the capacitance ratio with a microscopic information storage capacitor. Consequently, the storage capacity is divided by eight also in the direction of paired bit lines. Actually, the paired bit lines are divided by eight by the sense amplifier SA indicated by a thick black line. As will be described, the sense amplifier SA is based on shared sensing, but not limited thereto. In this scheme, paired bit lines are arranged to the right and left sides of each sense amplifier except in the case of the sense amplifiers arranged on both ends of the memory array, and the sense amplifier is selectively connected to either the right or the left paired bit lines.

Figure 13:
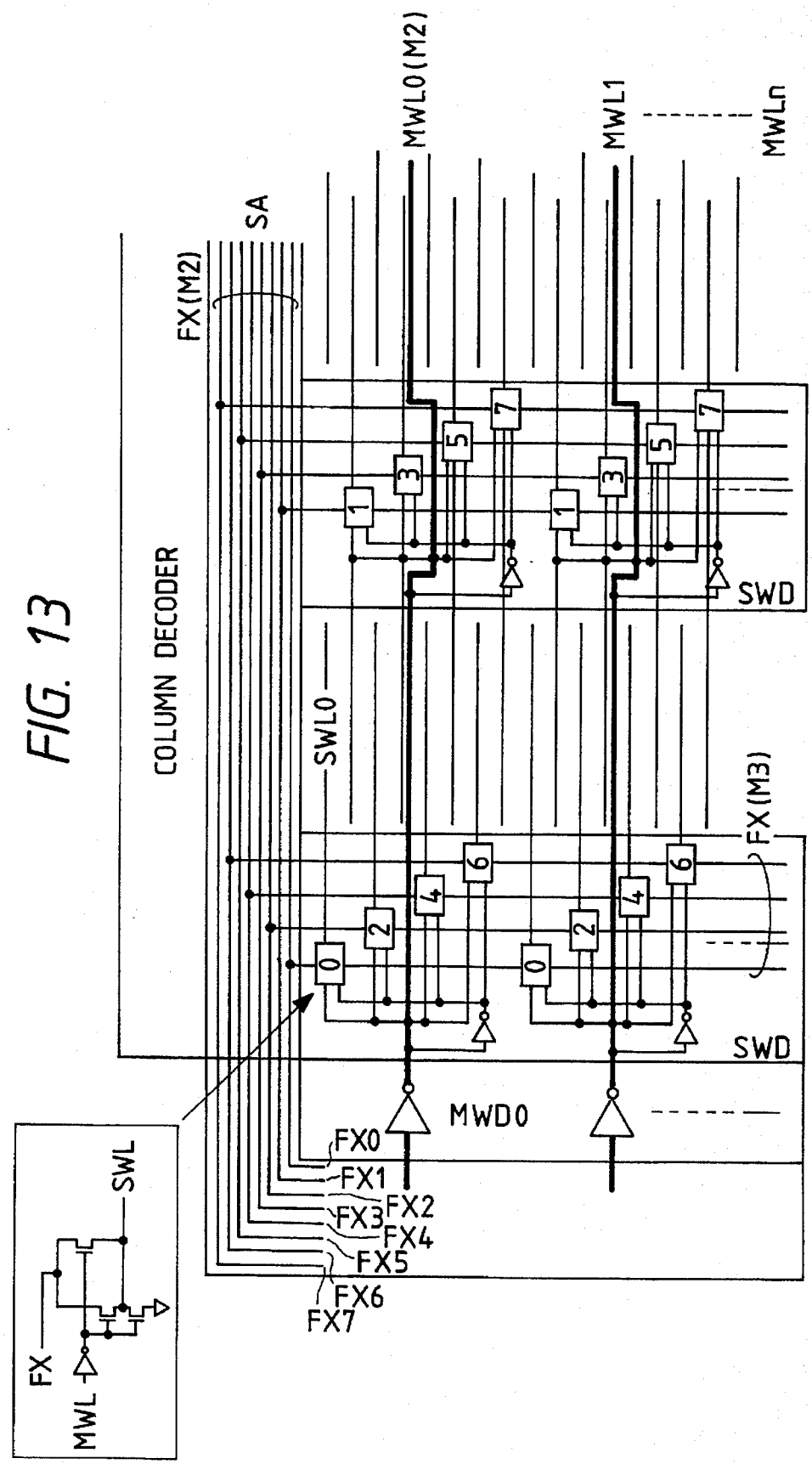
FIG. 13 is a block diagram illustrating a relationship between a main word line and a sub word line of the memory array of FIG. 12.

Referring to FIG. 13, there is shown a block diagram illustrating a relationship between the main word lines and the sub word lines on the above-mentioned memory array. In the figure, two main word lines MWL0 and MWL1 are typically shown. The main word line MWL0 is selected by a main word driver MWD0. The main word line MWL1 is selected in the same manner.

For the main word line MWL0, eight sub word lines are provided along the main word line. The even-numbered sub word lines 0 to 6 and the odd-numbered sub word lines 1 to 7, a total of eight lines, are arranged alternately on each memory block. The sub word driver arranged between memory blocks forms a select signal for selecting sub word lines in both the memory blocks on its right and left sides except for the even-numbered sub word lines 0 to 6 adjacent to the main word driver and the odd-numbered sub word lines 1 to 7 at the far end (the opposite side of the word driver) of the main word line.

As mentioned above, there are eight memory blocks in total. Because the sub word lines substantially corresponding to two memory blocks are simultaneously selected by the sub word driver as mentioned above, there are substantially four blocks. In the above-mentioned setup in which sub word lines are divided into the even-numbered and odd-numbered groups and the sub word drivers are arranged on both sides of each memory block, the substantial pitch of the sub word lines SWL arranged in high density according to the arrangement of the memory cells may be lowered by two in each sub word driver, resulting in a more efficient layout of the sub word drivers and sub word lines than the conventional layouts.

Each sub word driver supplies the select signal commonly to the four sub word lines 0 to 6 (or 1 to 7). The sub word driver also supplies an inverted signal obtained from an inverter. Sub word select lines FX are provided to select one of the above-mentioned four sub word lines. A total of eight sub word select lines FX0 through FX8 are provided. The even-numbered FX0 to FX6 are supplied to the even-numbered sub word drivers 0 to 6 and the odd-numbered FX1 to FX7 are supplied to the odd-numbered sub word drivers 1 to 7. In the periphery of each array, the sub word select lines FX0 through FX7 are formed on the metal wiring layer M2, the second layer of the chip, but not limited thereto. The sub word select lines are formed on the metal wiring layer M3, the third layer of the chip, in a portion where the sub word select lines cross the main word lines MWL0 through MWLn formed on the metal wiring layer M2.

Figure 14:
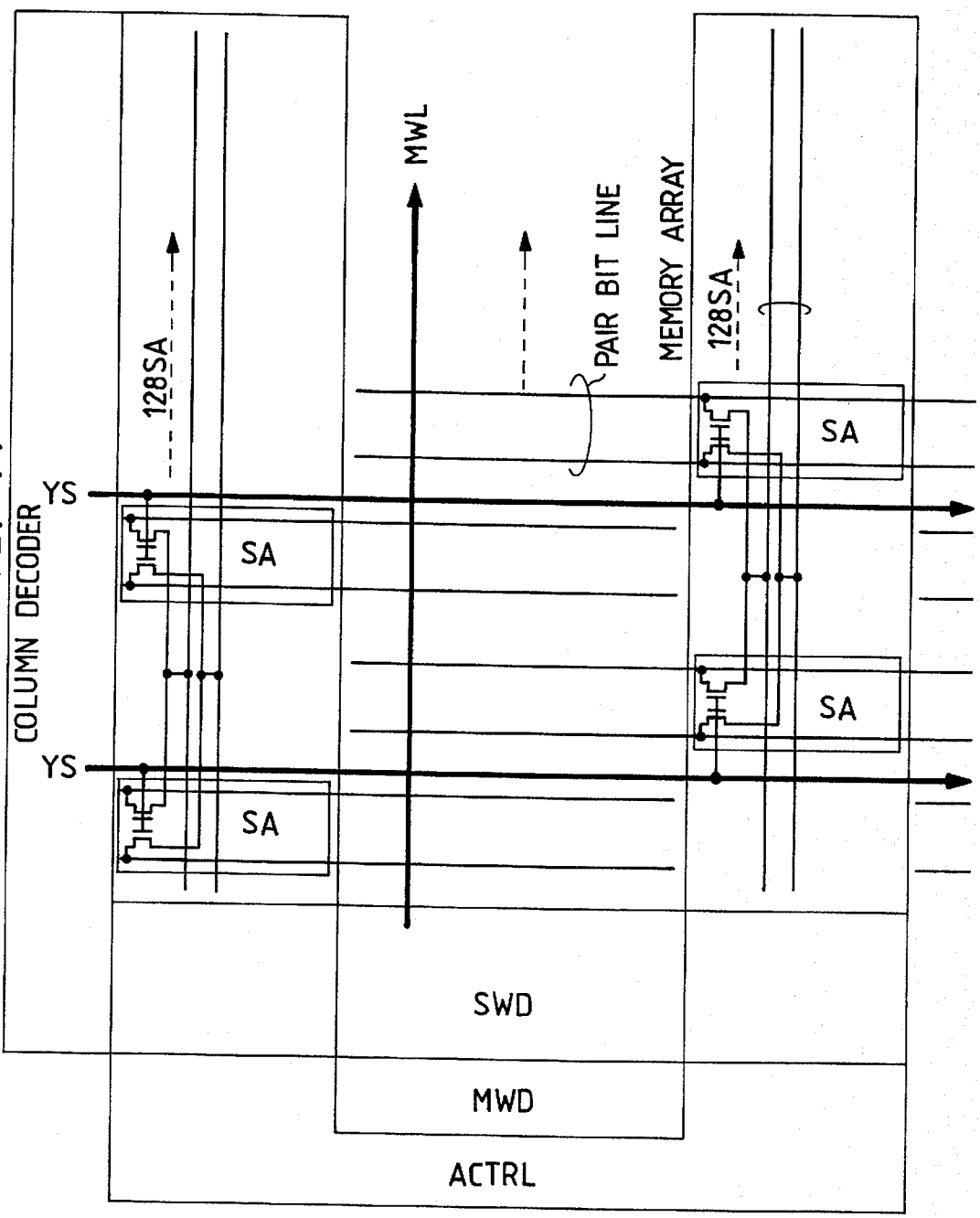
FIG. 14 is a block diagram illustrating a relationship between the main word line and a sense amplifier of the memory array of FIG. 12.

Referring to FIG. 14, there is shown a block diagram illustrating the relationship between the main word line and the sense amplifier on the memory array mentioned above. In the figure, one main word line MWL is typically illustrated. The main word line MWL is selected by the main word driver MWD. Adjacent to the main word driver MWD, the sub word driver SWD is provided for the above-mentioned even-numbered sub word lines.

Paired bit lines are arranged to orthogonally cross sub word lines, not shown, running in parallel to the main word line MWL. In the present embodiment, the paired bit lines are also divided into the even-numbered and odd-numbered rows, but not limited thereto. Sense amplifiers SA are arranged to the right and left sides of the memory block (memory array), the sense amplifiers respectively corresponding to the even-numbered and odd-numbered rows. The sense amplifiers SA are based on shared sensing as mentioned before. For each of the sense amplifiers located at the ends of the memory block, the paired bit lines are provided for the sense amplifiers substantially only one side thereof. These sense end-located amplifiers are connected to the paired bit lines via a shared switch MOSFET to be described later.

In the constitution in which the sense amplifiers are arranged on both sides of the memory block as described above, the paired bit lines are divided into the even-numbered and odd-numbered rows, resulting in a relatively sparse pitch of sense amplifier rows. Conversely, while arranging the paired bit lines densely, an element area on which the sense amplifiers SA are formed can be allocated. Input/output lines are arranged along the arrangement of the sense amplifiers SA. These input/output lines are connected to the paired bit lines via column switches. Each of the column switch is constituted by the switch MOSFET. The gate of this switch MOSFET is connected to column select lines YS over which a select signal of a column decoder.

In the present embodiment, the array blocks are also arranged divided as described before. Simultaneously selecting the four sub word lines for one main word line may reduce the refresh cycle to ¼. Namely, one full refresh operation may be performed by 1024 cycles. To select the four sub word lines simultaneously, addresses A0 and A1 of the least significant bits may only be made invalid.

Figure 15:
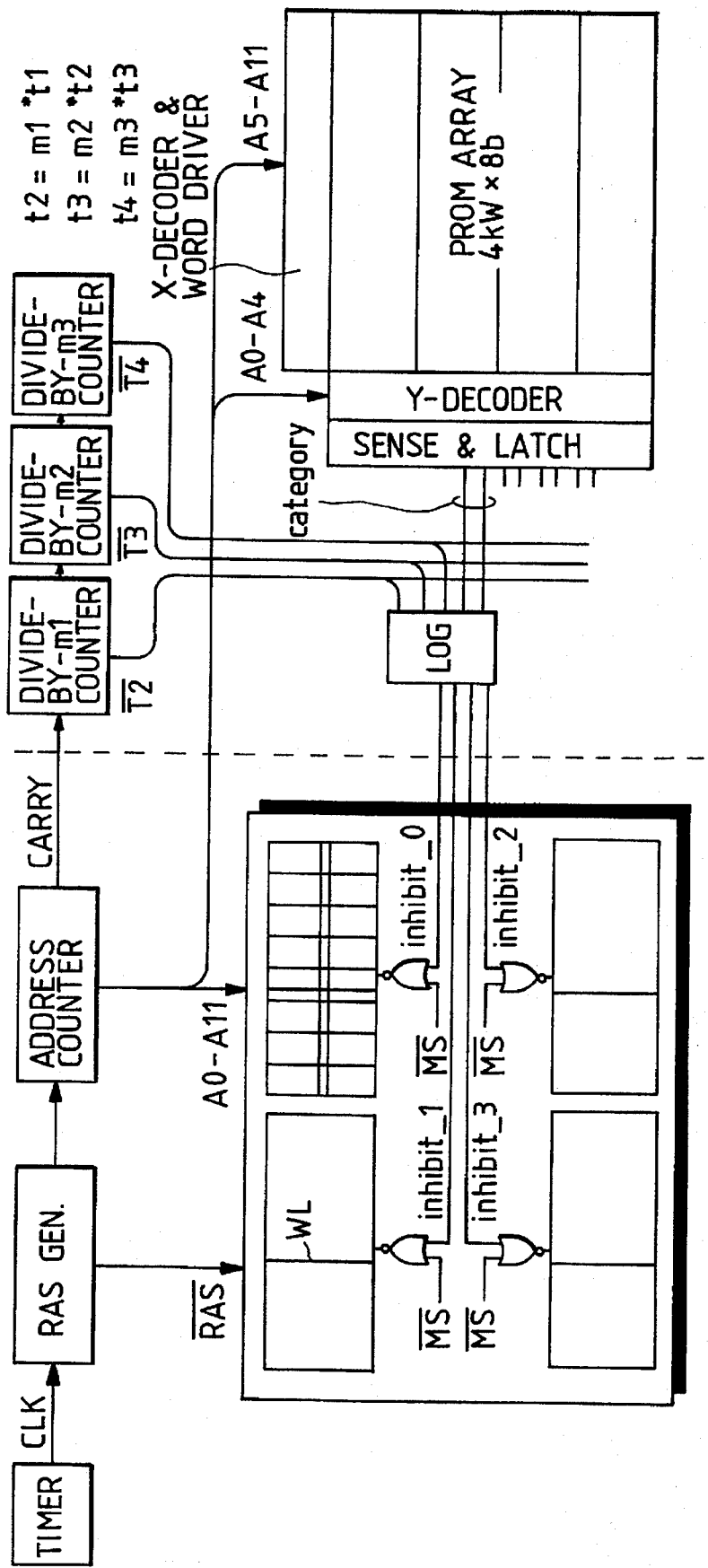
FIG. 15 is a schematic diagram illustrating still another preferred embodiment of the dynamic RAM associated with the invention.

Referring to FIG. 15, there is shown a schematic block diagram illustrating the dynamic RAM practiced as another preferred embodiment of the present invention. In the embodiment of FIG. 15, a plurality of long refresh periods such as T2, T3, and T4 are provided. Namely, the information retention times of memory cells are distributed continuously, from short to long, as described before. For further optimization, optimum refresh periods of the plurality of types are provided to effectively use the information retention times of the memory cells as far as possible.

A timer generates a clock signal CLK that corresponds to a memory cell having the shortest information retention time as described before. Relative to this clock signal, a carry signal CARRY of an address counter is divided by a first divider, a second divider, and a third divider with dividing ratios 1/m1, 1/m2, and 1/m3 respectively to form divided pulses /T2, /T3, and T4 respectively. Now, let one rotation of the address counter, or one period of the carry signal CARRY be t1, then the period t2 of the divided pulse /T2 of the first divider is set to m1×t1. Likewise, the period t3 of the divided pulse /T3 of the second divider is set to m2×t2 (=m1×m2×t1) and the period t4 of the divided pulse /T4 of the third divider is set to m3×t3 (=m1×m2×m3×t1).

Refresh time setting information (category) to be stored in the PROM according to three long periods including a short period is based on two bits. For example, if the refresh time setting information is '0' '0', the short period is provided. It is '0' '1', the long period corresponding to the divided pulse /T2 is provided. If it is '1' '0', the long period corresponding to the divided pulse T3 is provided. If it is '1' '1', the long period corresponding to the divided pulse /T4 is provided.

The above-mentioned refresh time setting information (category) is decoded by a logic circuit LOG to be logically multiplied by the divided pulses /T2, /3, and /T4 respectively, making invalid corresponding refresh time setting information by time ratios specified by the corresponding divided pulses. The resultant signals are ORed to provide refresh inhibit signals inhibits 0 through 3 to control whether a mat select signal /MS is to be made valid or invalid. To be specific, the word line on which the refresh time setting information corresponding to the divided pulse /T2 is set is refreshed in the period of t2; the word line on which the refresh time setting information corresponding to the divided pulse /T3 is set is refreshed in the period of t3; and the word line on which the refresh time setting information corresponding to the divided pulse /T4 is set is refreshed by the period of t4.

In the above-mentioned constitution, the memory cells having information retention times continuously distributed from short to long can be refreshed in the long periods according to the information retention time of each memory cell, resulting in further power saving.

Referring to FIG. 16 (A) and FIG. 16 (B), there are shown schematic diagrams illustrating a memory cell used for a PROM array of an adaptive refresh controller installed on the dynamic RAM associated with the invention, the memory cell being practiced as one preferred embodiment of the invention. This embodiment uses nonvolatile memory cells each having floating gates and a control gate. The floating gates are electrically charged to alter their threshold voltage for information storage.

In the present embodiment, the nonvolatile memory cells are formed by using DRAM fabrication process, so that the gates are formed by a single-layer polysilicon. In FIG. 16 (A), the memory cell of NMOS type is shown, while in FIG. 16(B), the memory cell of PMOS type is shown.

In the memory cell of NMOS type in FIG. 16(A), the floating gates are formed on a thin gate insulating film on a semiconductor area enclosing n+ type source and drain diffusion layers. The single-layer floating gates are formed over to an adjacent element forming area beyond a field insulating film for element separation. The element forming area is formed with a control gate consisting of the n+ type diffusion layer. The control gate also serves as a word line WL.

In the memory cell of PMOS type in FIG. 16(B), the floating gates are formed on a thin gate insulating film on a semiconductor area enclosing n+ type source and drain diffusion layers. The floating gates are formed over to an adjacent element forming area beyond a field insulating film for element separation. The element forming area is an n-type well area, on which a control gate consisting of p-type diffusion layer is formed. The control gate also serves as a word line WL. In the PMOS type, the control gate is formed on the n-type well area, so that the field insulating film for element separation gets wider than that of the NMOS type, resulting in a slightly wider memory cell size.

The above-mentioned single-gate structure makes it possible to form the PROM that constitutes an adaptive refresh controller by using the DRAM fabrication process, or the same fabrication as that used for the DRAM main. The PROM is written with refresh time setting information for only a single time in correspondence with the information retention time of each word line. Therefore, unlike the conventional EPROM, this PROM need not have an ultraviolet light erasing window.

Figure 17:
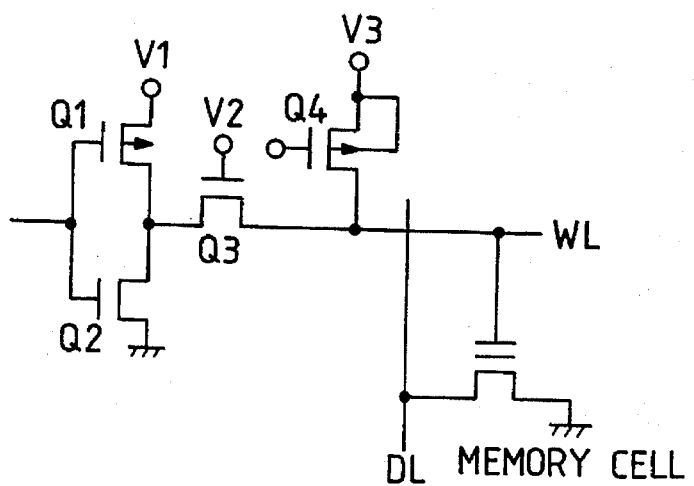
FIG. 17 is a schematic circuit diagram illustrating the PROM of FIG. 16 practiced as one preferred embodiment of the invention.

Referring to FIG. 17, there is shown a schematic circuit diagram illustrating the PROM of FIG. 16 practiced as one preferred embodiment of the invention. A word line WL is connected to the control gate. The source of the memory cell is grounded and the drain is connected to a data line DL. The word line is provided with a load MOSFET Q4 having high resistance. The load MOSFET Q4 consists of a p-channel MOSFET, but not limited thereto, the source thereof being connected to a power supply terminal V3 that is set to high voltage at a write operation. The word line WL is connected to an output terminal of a word driver via an n-channel MOSFET Q3 of which gate is normally applied with power voltage V2. The word driver comprises a CMOS inverter made up of a p-channel MOSFET Q1 and an n-channel MOSFET Q2. An operating voltage V1 of the word driver is the same as the power voltage V2, but not limited thereto.

In a read operation, a power supply terminal V3 provides circuit ground or the power voltage, so that the p-channel MOSFET Q4 is substantially turned off. When the Q4 is turned off, the word line WL is made high or low according to high or low level of the output signal of the word driver. It should be noted that the high level of the word line is lower than the high level of the word driver by a threshold voltage value of the n-channel MOSFET Q3.

In a write operation, the power supply terminal V3 is applied with a high voltage such as about 12 V. When the output signal of the word driver is low, the word line WL is made low because the conductance of the MOSFET Q2 is sufficiently low as compared with the MOSFET Q4. When the output signal of the word driver is made high, the MOSFET Q3 is turned off, so that the word line WL provides a high voltage such as about 12 V via the MOSFET Q4 serving as high resistance, corresponding to the power supply terminal V3. At this moment, if the data line DL is supplied with a high-level write signal, the memory cell turns on and the hot electron generated in a high field domain in the proximity of the drain is injected in the floating gate to perform the write operation. If the data line DL is low, no current flows in the memory cell, so that a write operation such as mentioned above is not performed.

The memory cell with its floating gate injected with the hot electron has a high threshold voltage for the select level of the word line in a read operation such as mentioned above. Consequently, despite the word line is made high by the word driver, the memory cell is turned off to prevent a memory current from flowing. The memory current corresponding to the memory cell on/off state caused by the electron injection or no injection in the floating gate is detected by a sense amplifier to provide '0' or '1' read signal.

Figure 18:
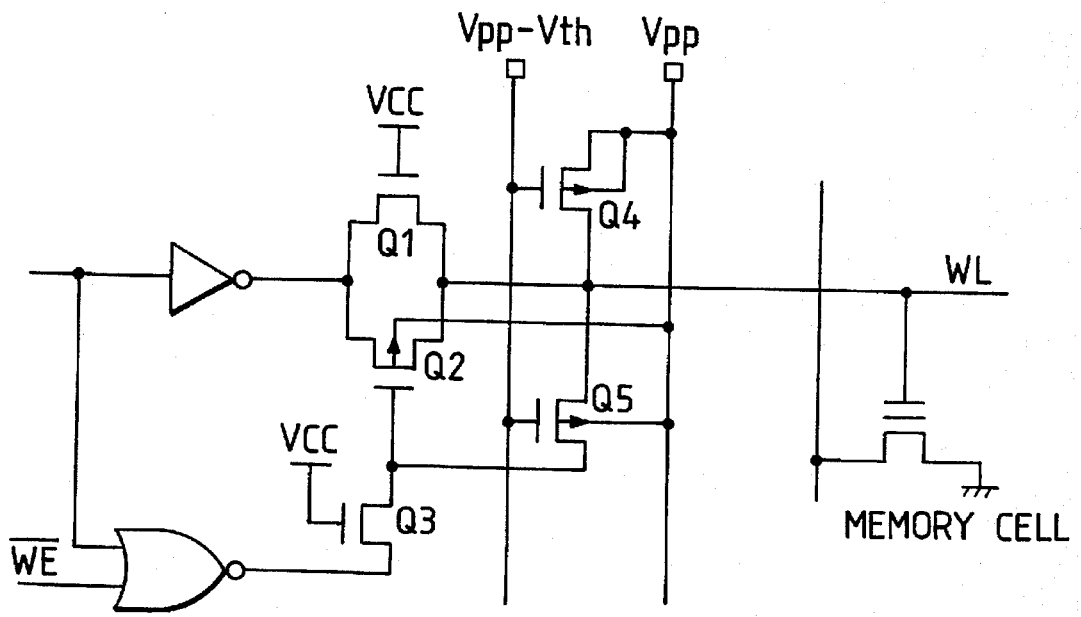
FIG. 18 is a schematic circuit diagram illustrating the PROM of FIG. 16 practiced as another preferred embodiment of the invention.

Referring to FIG. 18, there is shown a schematic circuit diagram illustrating the PROM of FIG. 16 practiced as another preferred embodiment of the invention. In this embodiment, a word driver constitution is different from that of the embodiment of FIG. 17. In a read operation, when a signal /WE goes high, the source of an n-channel MOSFET Q3 of which gate is supplied with power voltage VCC goes low, so that the MOSFET Q3 is turned on, transmitting the low level to the gate of a p-channel MOSFET Q2. Because the gate of an n-channel MOSFET Q1 is normally supplied with the power voltage VCC, the Q1 is in the turned-on state. Therefore, an output signal of a CMOS inverter constituting a similar word driver is passed directly to a word line WL.

In the read operation, when the signal /WE goes low and a low-level select signal is supplied, the source of the n-channel MOSFET Q3 of which gate is supplied with the power voltage VCC goes high, so that the MOSFET Q3 is turned off to supply high voltage to the gate of the p-channel MOSFET Q2 through a p-channel MOSFET Q5. This also turns off the MOSFET Q2. Because the gate of the n-channel MOSFET Q1 is normally supplied with the power voltage VCC, the Q1 is in the turned-on state. The Q1 is turned on by the high level of the output signal of the word driver. Therefore, high voltage VPP for writing is transmitted to the word line WL through a p-channel MOSFET Q4.

If a high-level deselect signal is supplied to the input of the word driver, the output of a NOR gate goes low, tuning on the n-channel MOSFET Q3. This turns on the p-channel MOSFET Q3, transmitting the low level of the output signal of the word driver to the word line WL. The on-resistance values of the p-channel MOSFETs Q4 and Q5 are higher than those of the n-channel MOSFETs constituting the above-mentioned word driver, so that the word line WL is made low in correspondence with the output signal of the word driver. The write and read operations on the memory cell are the same as those described before and therefore will not be described herein.

Figure 19:
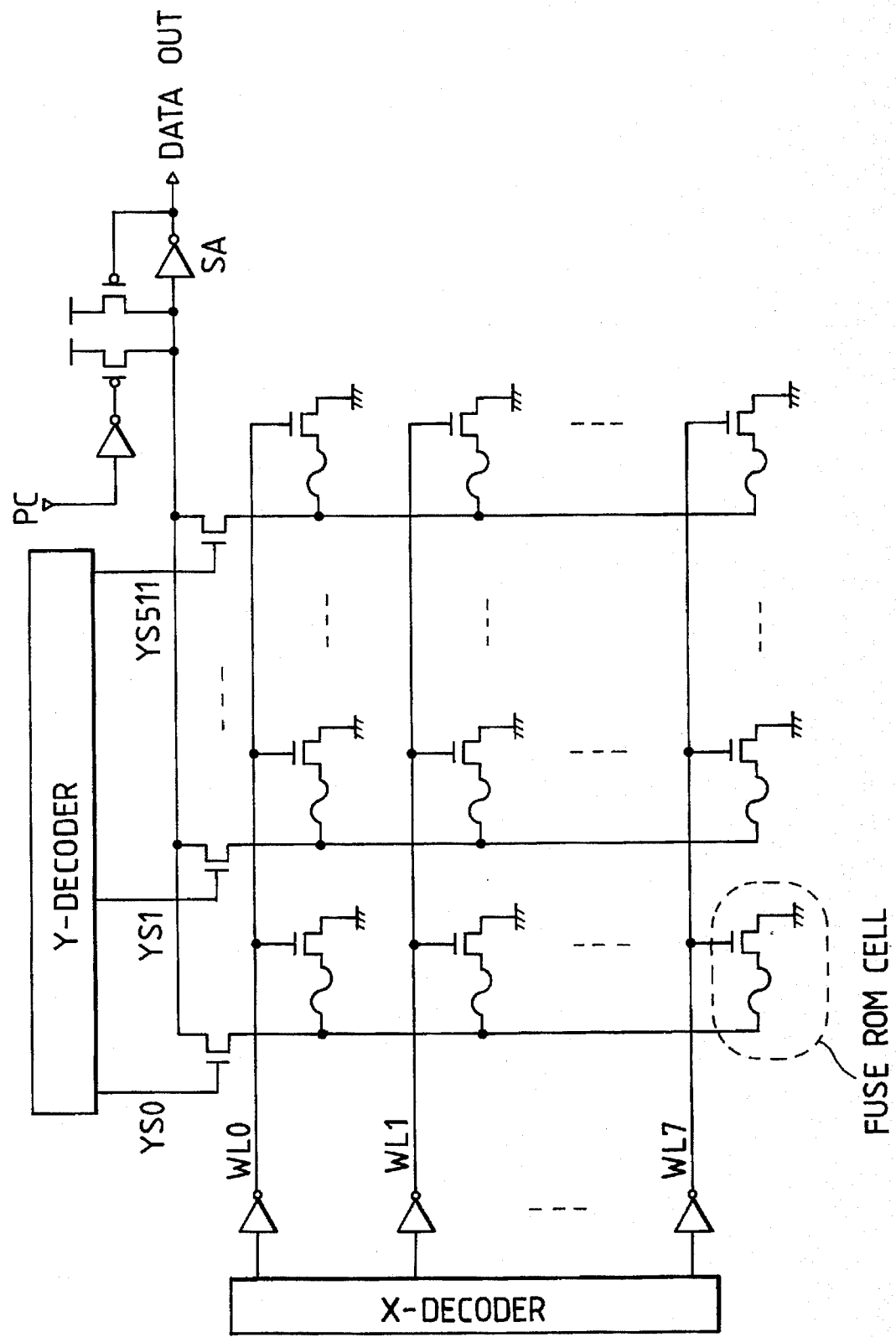
FIG. 19 is a schematic circuit diagram illustrating the PROM of FIG. 16 practiced still another preferred embodiment of the invention.

Referring to FIG. 19, there is shown a schematic circuit diagram illustrating the PROM of FIG. 16 practiced as still another preferred embodiment of the invention. In this embodiment, a fuse is used for storing information. A memory cell is constituted by MOSFETs. The source of each of the MOSFETs is connected to circuit ground, the gate is connected to a word line, and the fuse is provided between the drain and a data line. The fuse is blown by selectively applying an energy radiation such as laser beam, but not limited thereto.

Word lines WL0 through WL7 are selected by an X-decoder. The data lines are selectively connected to an input line (common data line) of a sense amplifier SA via a column switch. The gate of a MOSFET constituting the column switch is supplied with select signals YS0 through YS11 formed by a Y-decoder.

The input line (common data line) of the sense amplifier SA is provided with a precharge MOSFET. In the PROM of the present embodiment, when a signal PC goes high in a deselected period, the p-channel precharge MOSFET is turned on, charging the common data line to the high level as of power voltage VCC. If the fuse of the memory cell at an intersection between the selected word line and data line is blown, it indicates that no discharge path is formed for the common data line. Therefore, the common data line remains high and the output signal of an inverter constituting the sense amplifier SA is made low. When the output signal is made low, the p-channel MOSFET provided on the input side is turned on to latch the common data line in which the common data line made high in floating state is made high.

If the fuse of the memory cell provided at the intersection between the selected word line and data line is not blown, the common data line is made low by the forming of a discharge path composed of the column switch MOSFET, the data line, the memory cell fuse, and the MOSFET connected to the fuse. The inverter constituting the sense amplifier SA sets the output signal to the high level when the input signal goes low. Because the common data line is fixed to the low level by the discharge path when reading the high level of the output signal, the sense amplifier SA need not provide a circuit for performing the above-mentioned latch operation.

Figure 20A:
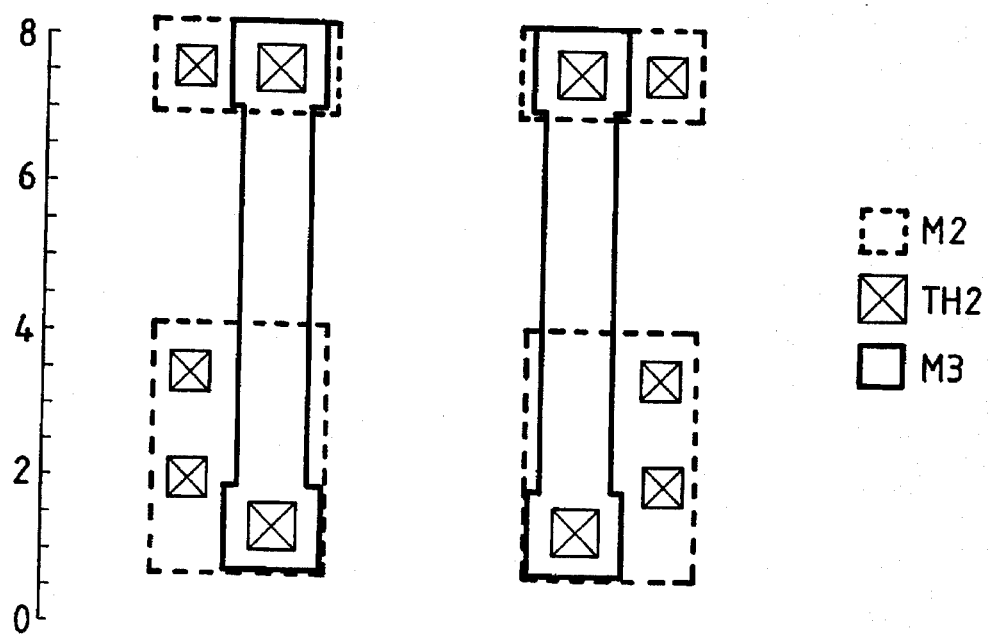
FIG. 20 (A) and FIG. 20 (B) are block diagrams illustrating one preferred embodiment of two memory cells in the PROM of FIG. 19.
Figure 20B:
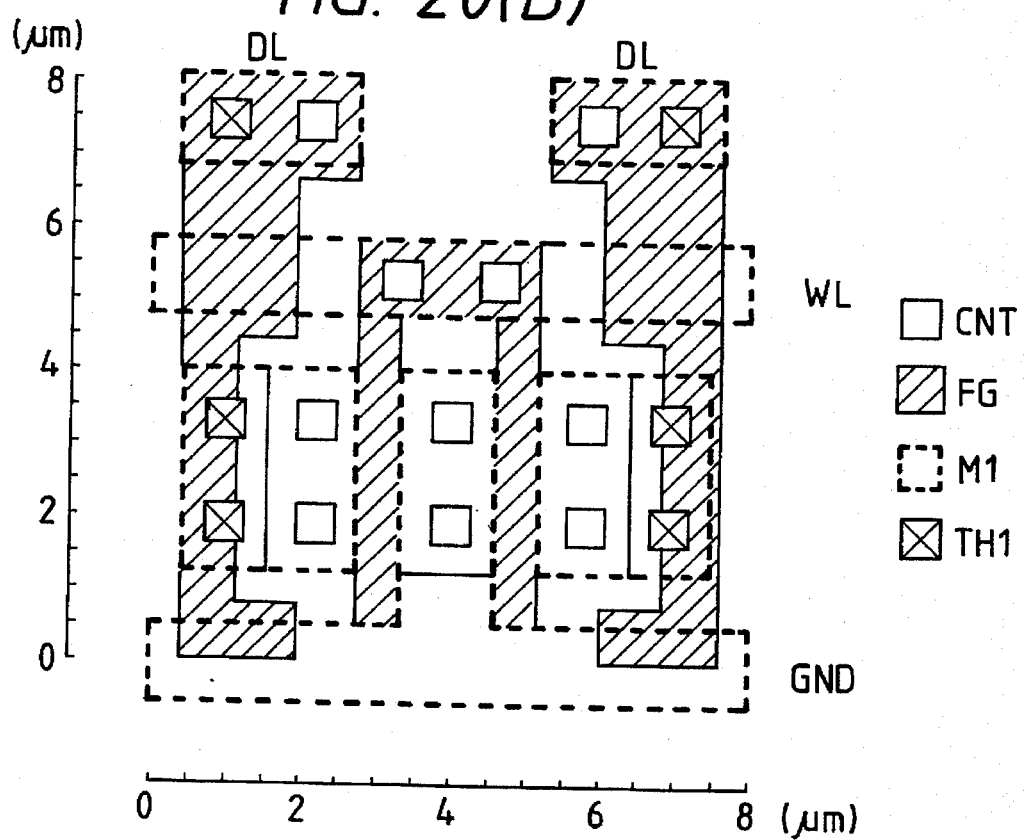

Referring to FIG. 20 (A) and FIG. 20 (B), there are shown block diagrams illustrating one preferred embodiment of the two memory cells of the embodiment of FIG. 19. FIG. 20 (A) shows patterns of a metal layer M2 of second layer, a metal layer M3 of third layer, and a through-hole TH2. FIG. 20 (B) shows a pattern of a metal layer M1 of first layer, a polysilicon layer FC of first layer, a through-hole H1, and a contact hole CNT. Actually, the patterns of FIG. 20 (A) and FIG. 20 (B) are superimposed on each other; the patterns are shown separately for simplicity.

A fuse is formed on the top metal (aluminum for example) layer adapted to be blown by radiation of laser for example. Both ends of the fuse are led via the through hole TH2 to the metal layer M2 on the second layer to be connected to a data line DL at the upper portion. Namely, the metal layer M2 of the second layer is connected via the metal layer M1 of the first layer to the data line DL made up of the polysilicon FG on the first layer and running vertically. The word line is constituted by the metal layer M1 of the first layer and formed in the lateral direction. The metal layer M1 is connected to the polysilicon layer FG of the first layer that constitutes the gate of each MOSFET.

The metal layer M3 of the third layer that constitutes the above-mentioned fuse is connected to the metal layer M2 of the second layer at the lower portion and is further connected to the diffusion layer of the drain via the metal layer M1 of the first layer. The source diffusion layer is made common to the two MOSFETs to be supplied with ground potential GND.

Figure 21:
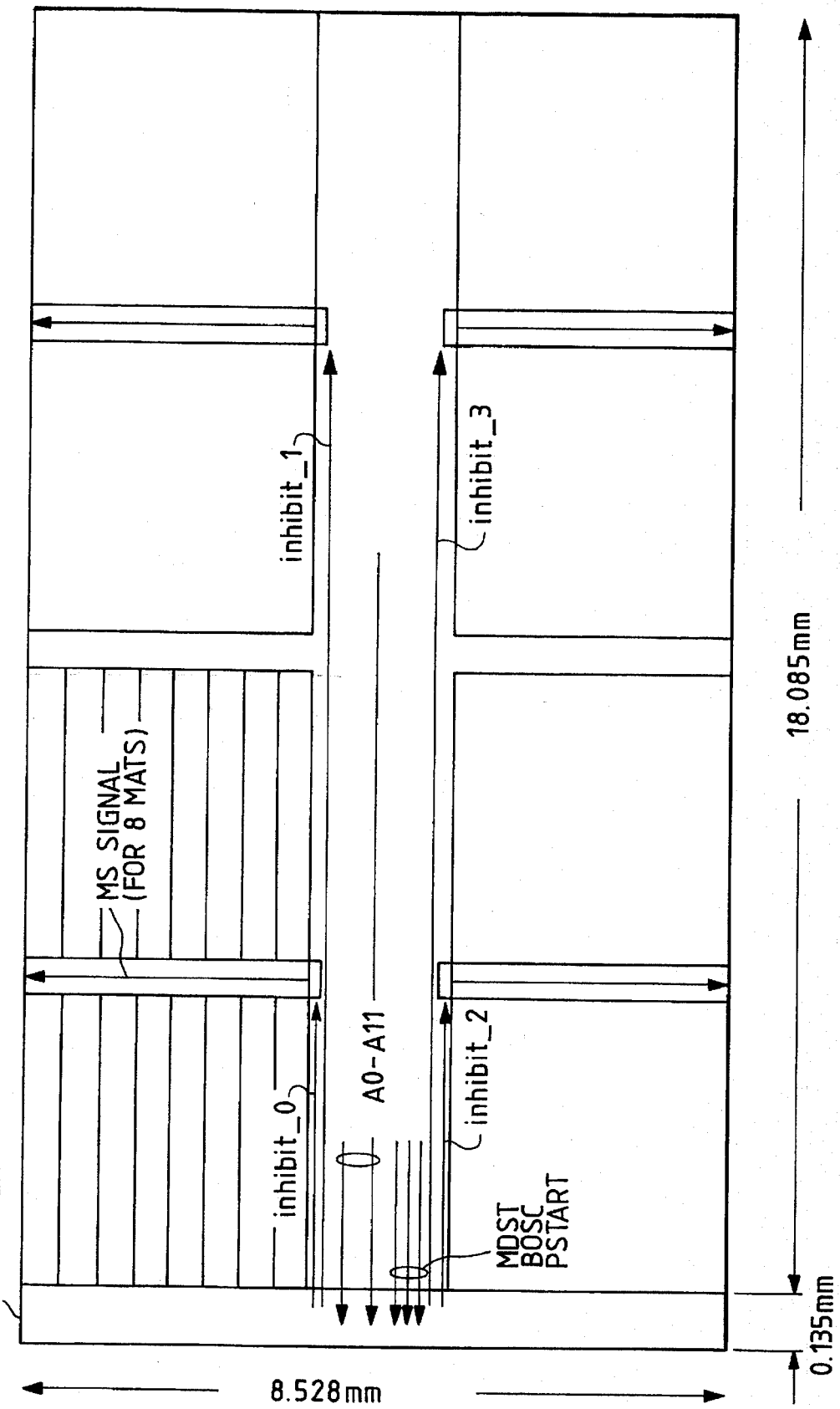
FIG. 21 is a schematic layout diagram illustrating one preferred embodiment of the dynamic RAM associated with the invention.

Referring to FIG. 21, there is shown a schematic layout illustrating the dynamic RAM practiced as one preferred embodiment of the invention. In this embodiment, a PROM provided on the adaptive refresh controller is constituted by the above-mentioned fuse, but not limited thereto. This PROM has a long layout along a word line by arranging only several memory cells to be connected to long word line. This constitution allows the PROM to be arranged on a memory chip at one end along the length of the same. As a result, the size of the memory chip may only be increased along the length by about 0.1351 mm.

In the embodiment of FIG. 21, refresh address signals A0 through A11 are supplied by wiring running through the center area of the memory chip along the length thereof to the end portion in which the adaptive refresh controller is formed. Refresh inhibit signals inhibit-0 through inhibit-3 outputted from the adaptive refresh controller are supplied to four largely divided memory mats.

Figure 22:
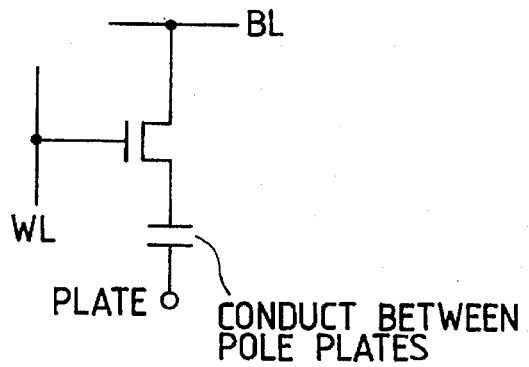
FIG. 22 is a circuit diagram illustrating another preferred embodiment of the memory cell used for the PROM of the adaptive refresh controller associated with the invention.

Referring to FIG. 22, there is shown a circuit diagram of another preferred embodiment of memory cells used in the PROM of the adaptive refresh controller associated with the present invention. In this embodiment, dynamic memory cells are used. Unlike the other embodiment in which a capacitor is used for a dynamic memory cell for information storage, the embodiment of FIG. 22 destroys the capacitor to make the same conduct between electrodes of the capacitor for information storage.

Therefore, unlike the dynamic RAM memory cell, the plate electrode of the memory cell of the present embodiment is adapted such that its voltage can be altered. Namely, in the write operation, this voltage is made equal to or slightly higher than the power voltage. The memory cell to be destroyed is applied with circuit ground voltage via the data line to supply a relatively high voltage between both electrodes, causing dielectric breakdown. A memory cell not to be written is supplied with a high level corresponding to the power voltage, preventing the high voltage from being applied.

When performing a read operation by using a sense amplifier same as the DRAM, the plate voltage is set to a level slightly higher than the intermediate voltage. In the memory cell having the capacitor dielectrically broken, a voltage higher than the intermediate voltage is outputted. For the capacitor not dielectrically broken, a low-level output signal is outputted. Namely, unless refreshed, the dynamic memory cell is discharged, being held at the low level.

Figure 23:
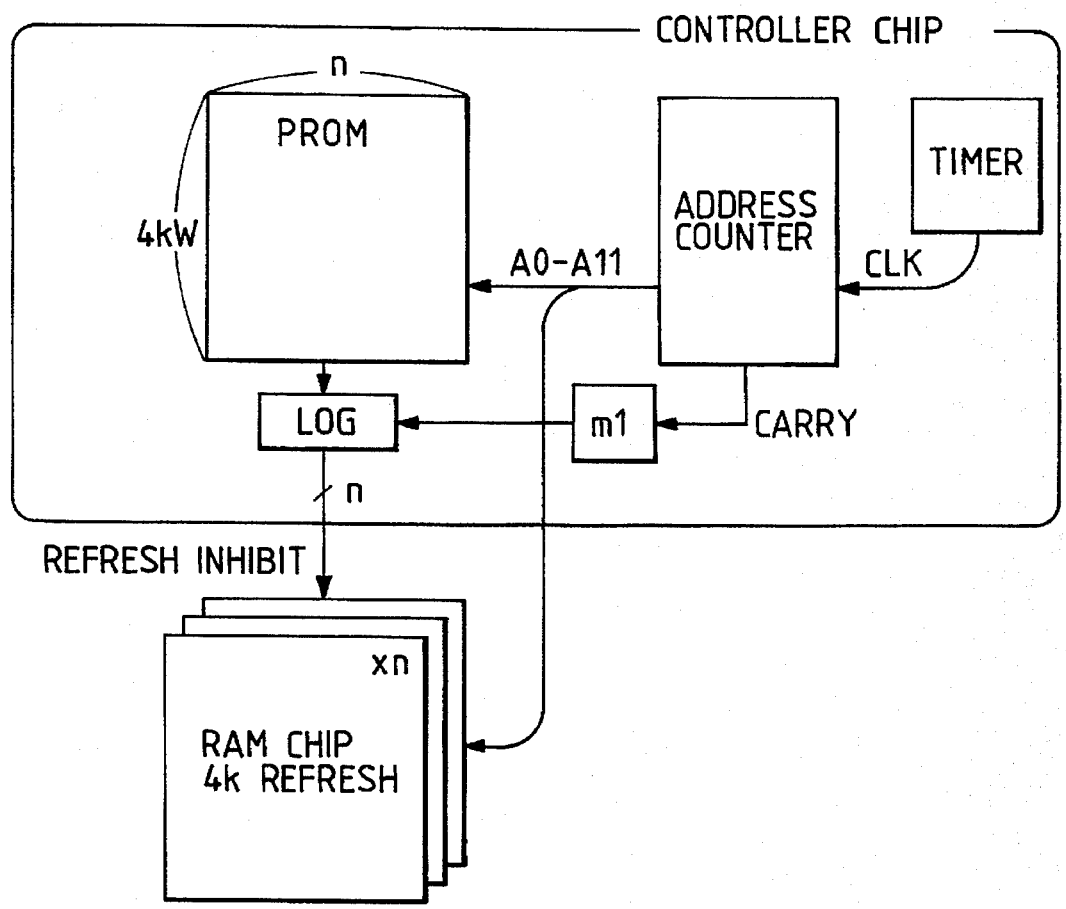
FIG. 23 is a block diagram illustrating one preferred embodiment of a memory module associated with the invention.

Referring to FIG. 23, there is shown a schematic block diagram illustrating the memory module practiced as one preferred embodiment of the invention. The embodied memory module is composed of a plurality of DRAM chips and a controller chip both installed on one packaging substrate. Each of the plurality of DRAM chips has a known refresh controller. In a normal memory access operation, a refresh operation is performed by a normal refresh control operation, CBR (CAS Before RAS refresh) or the like.

The controller chip is provided with an adaptive refresh controller comprising a timer, an address counter, and a PROM. The PROM holds refresh time setting information for specifying long period or short period for the information retention time in DRAM corresponding to each refresh address. In CBR refresh, a refresh operation is performed by a built-in refresh counter; therefore, it is impossible to externally know which word line is selected. Hence, RAS-only refresh is used in the memory module. Namely, a RAS signal and an address signal necessary for a RAS-only refresh operation are supplied from the controller chip to the DRAM chips.

For example, when the refresh time setting information is of two types, namely short and long periods as mentioned before, if the refresh time setting information from the PROM is of short period, a RAS signal is entered in the DRAM at a particular refresh address A0 to A11 in synchronization with a clock signal CLK generated by the timer, thereby refreshing the particular refresh address A0 to A11. If the refresh time setting information from the PROM to a particular refresh address A0 to A11 is of long period, the generation of the RAS signal is inhibited in general, performing no refresh operation in general. In this case, a carry signal CARRY from the address counter is divided by a divider into l/ml to cause a logic circuit LOG to make invalid the above-mentioned signal from the PROM.

The refresh time setting information of long period is substantially a signal for inhibiting a refresh operation. Therefore, by making invalid the refresh time setting information by the divided pulse formed by the divider once in m times, the refresh operation can be performed. Thus, the refresh operation of long period is m times as long as a refresh operation of short period, in which the division ratio of the divider is l/m.

Figure 24:
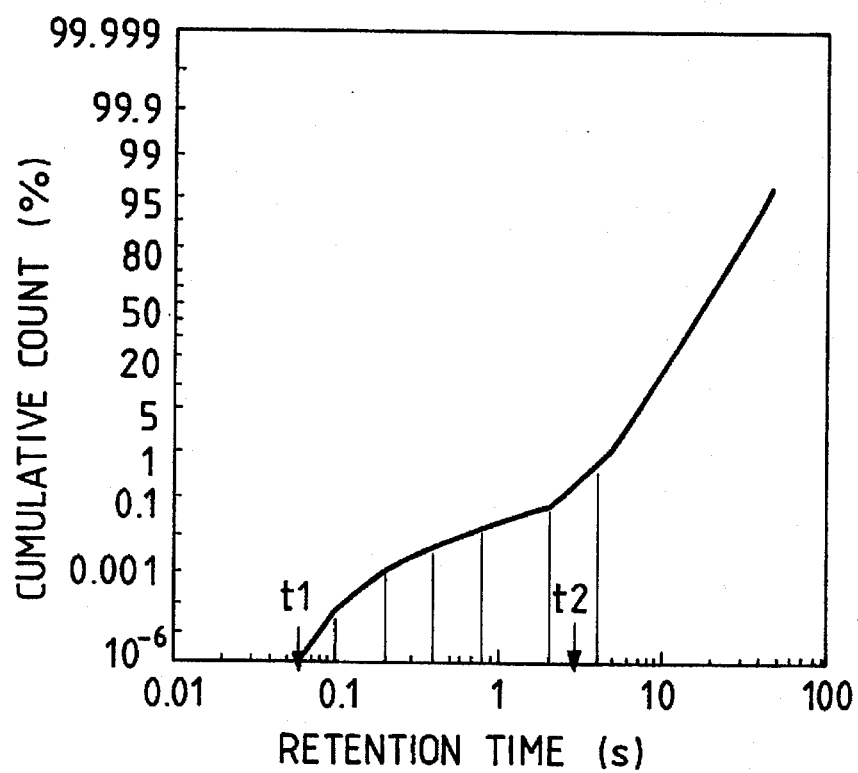
FIG. 24 is a characteristics diagram illustrating a relationship between memory cell information retention time and cumulative count to describe the refresh method associated with the invention.

Referring to FIG. 24, there is shown a characteristics diagram illustrating a relationship between memory cell information retention time and cumulative count to describe the refresh method associated with the invention. Memory cells formed on a DRAM are different in information retention time due to fabrication process dispersion and the like. The information retention times of the memory cells and widely and continuously distributed, from less than 0.1 second to more than 10 seconds. And, as a whole, many memory cells tend to have relatively long information retention times. The conventional refresh method has taken no actions against the distribution of memory cell information retention times, simply determining the refresh period relative to the shortest information retention time t1. Because the refresh period is determined by the information retention times of very small number of memory cells compared with the whole, it is known from the cumulative account how much the information retention times are wasted as a whole, thereby increasing the current consumption.

In the present embodiment, the shortest information retention time t1 provides the short period for which a retention time t2, an integral multiple of t1, providing long period, is selected to be used for refreshing those memory cells which have longer information retention times than t2. This setup permits significant power saving because less than 1% of all memory cells are refreshed by the short period while the rest 99% can be refreshed by long period t2.

Figure 25:
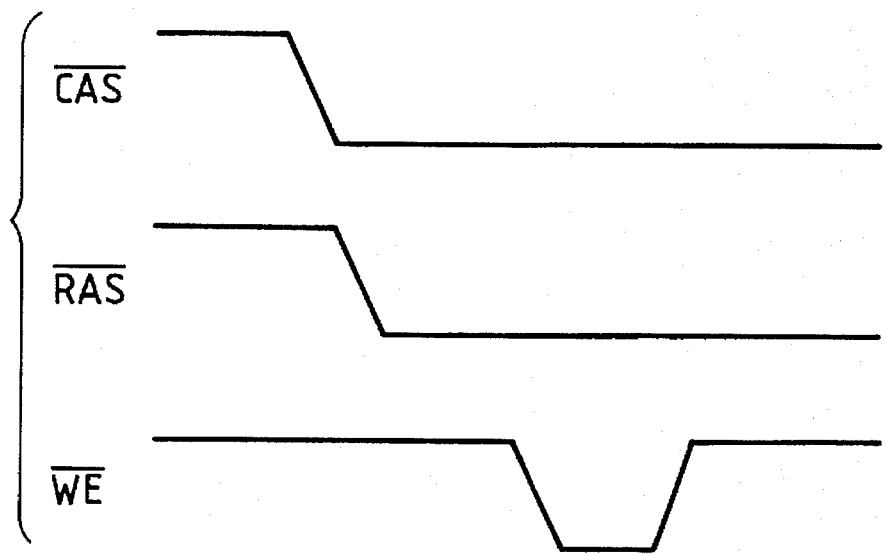
FIG. 25 is a timing chart indicating one preferred embodiment for activating the adaptive refresh controller associated with the invention.

Referring to FIG. 25, there is shown a timing chart describing a timing in which the adaptive refresh controller associated with the invention is activated. An adaptive refresh operation in the present embodiment is not a refresh operation to be performed at normal memory access; rather, the adaptive refresh operation is used for self refreshing when the DRAM is put in the standby state. Namely, the refresh mode is entered in the CBR timing and when a write enable signal /WE is made low, the operation of the adaptive refresh controller is made valid from the normal CBR refresh operation, performing the adaptive refresh operation (super low-power mode) corresponding to the refresh time setting information stored in the PROM. In the super low-power mode, a data retention operation equivalent to that of a static RAM can be realized by switching a substrate back-bias voltage generator to the low-power mode.

Such a DRAM having commands as a synchronous DRAM may make valid the operation of the adaptive refresh controller by setting a particular command. Thus, the method of activating the refresh operation by the adaptive refresh controller may be embodied in a variety of manners including one in which a special external control terminal is provided. Also, the method of activating the refresh operation by a refresh controller installed on a memory module may be embodied in a variety of manners including one in which a register to be written with a flag for indicating an adaptive refresh operation is provided.

Figure 26:
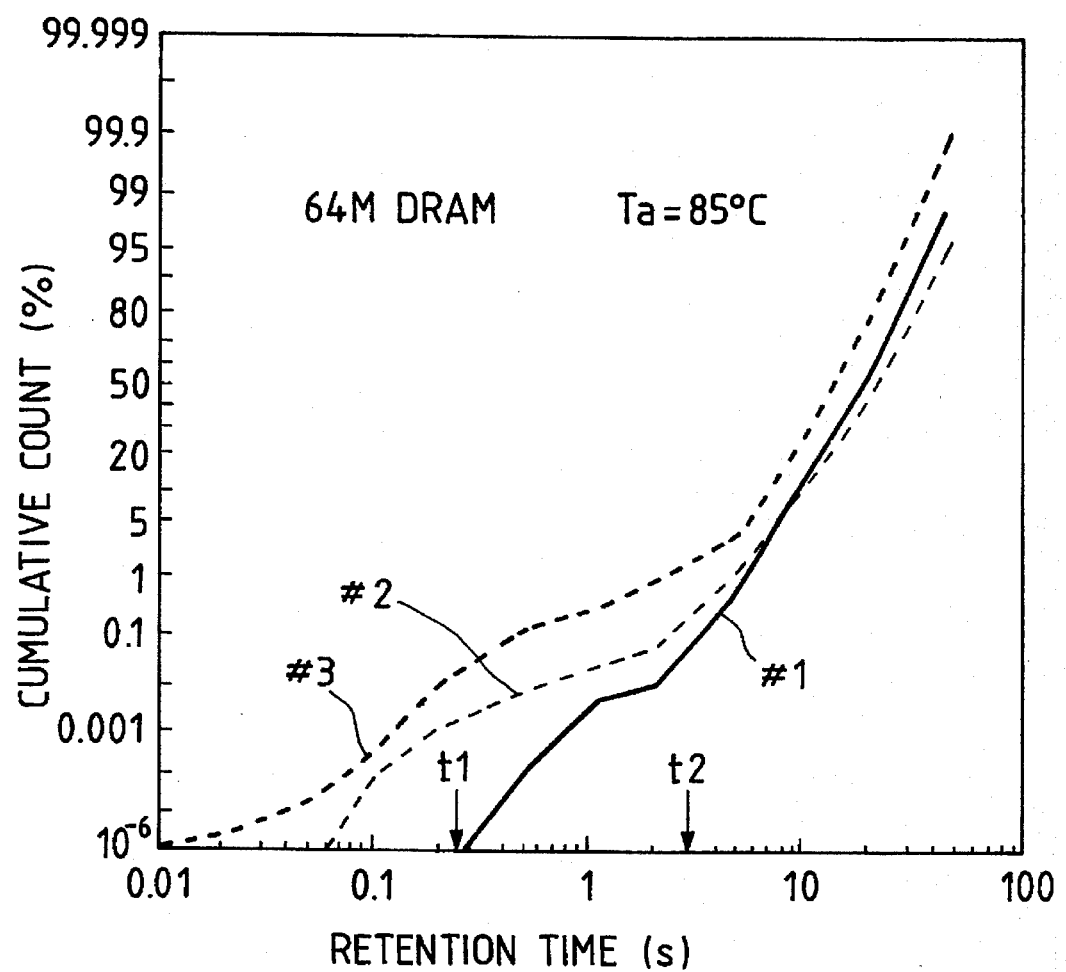
FIG. 26 is a characteristics diagram illustrating a relationship between memory cell information retention time and cumulative count to describe the invention.

Referring to FIG. 26, there is shown a characteristics diagram illustrating a relationship between memory cell information retention time and cumulative count to describe the present invention. As described before, the memory cells formed on the DRAM have different information retention times due to the fluctuation in fabrication process and the like and differ in distribution among DRAM #1 to DRAM #3. Therefore, if the overall information retention time of is fixed to t1 or t2 corresponding to the DRAM #1 for example, data retained in some memory cells on the DRAM #2 and DRAM #3 may be destroyed. To prevent this problem from happening, the timer is programmed to generate clock signals CLK corresponding to the shortest information retention times of the DRAMs #1 through #3. An oscillating frequency of this timer may be made programmable by methods including the above-mentioned method in which the time constant of an oscillator is trimmed through a fuse. According to the distribution of the information retention times of the DRAM #1 through DRAM #3, the time t2 of long period may also be set to a desired value. The setting of the t2 is implemented by providing a divider of variable type.

Referring to FIG. 26, there is shown a characteristics diagram illustrating a relationship between long period and average refresh period to describe the adaptive refresh method associated with the invention. The above-mentioned time t2 of long period has an optimum value. Namely, as this time t2 is made longer, the number of refresh times per unit time in long period decreases, resulting in reduced current consumption. At the same time, the number of word lines for refreshing in short period increases, resulting in increased current consumption.

The average refresh period tR of the refresh operations in the short period t1 and the long period t2 is obtained from equation (1) below:

$$1/tR = (1 - Pm(t2))/t1 + Pm(t2)/t2 \tag{1}$$

where, $Pm(t2)$ is a ratio of the word lines for refreshing in the long period t2 to the word lines for short-period refreshing and obtained from equation (2) below:

$$Pm(t2) = (1 - Pcell(t2))^m \tag{2}$$

where m stands for the number of memory cells per one word line and $Pcell(t2)$ stands for the probability that the memory cell refresh time is below t2.

Figure 27:
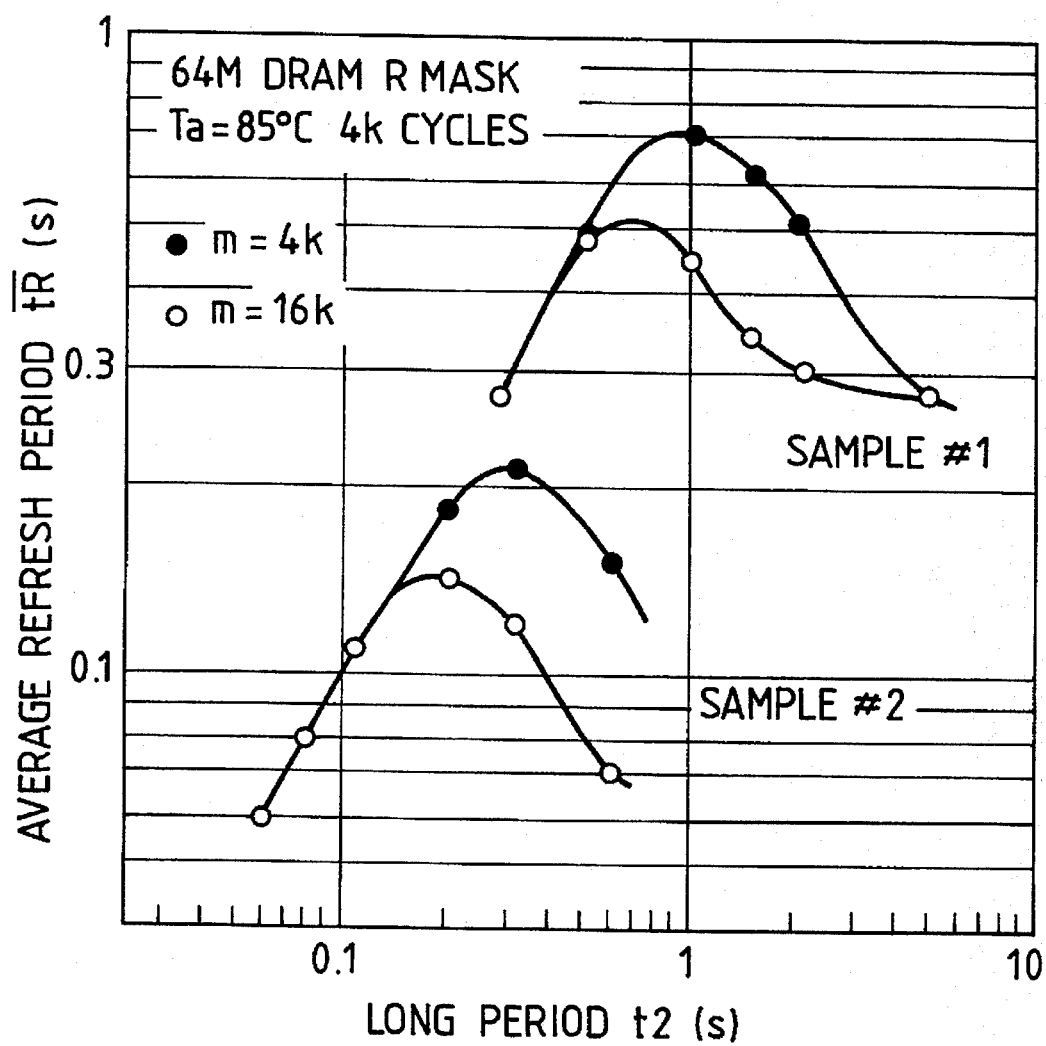
FIG. 27 is a characteristics diagram illustrating a relationship between long period and average refresh period to describe the adaptive refresh method associated with the invention.

FIG. 27 also shows the characteristic for describing the optimum refresh period of the refresh method associated with the invention. In the figure, two samples #1 and #2 are shown each of which shows the cases of 4K and 16K, the numbers of memory cells per word line. As the long period t2 is made longer relative to the short period t1, the average refresh period is made loner, decreasing the power consumption. However, making the long period t2 longer increases the number of memory cells that must be refreshed in short period, shortening the average refresh period. Consequently, the long period t2 is set in correspondence with the peak in the above-mentioned characteristic. Namely, the long period t2 is selected such that the equation (1) above produces a minimum value (or tR becomes maximum).

The above-mentioned memory cell information retention time determination is actually made by performing a pose test at several points such as 50 ms, 100 ms, 400 ms, 800 ms, 2 s, 4 s, and the like, to read stored information at each of these time points to check if the stored information is lost or not. From the result of the pose test, the shortest information retention time t1 and the optimum long period t2 are obtained to set the frequency of the clock signal CLK of the timer and the dividing ratio of the divider. At the same time, the refresh time setting information is written to the PROM, indicating short period refresh or long period refresh for each refresh address.

If the short-period refresh or long-period refresh is specified for each refresh address collectively, the number of memory cells to be refreshed simultaneously increases inevitably. As a result, if there exists even one memory cell, for example, to be refreshed in short period, all the other memory cells must also be refreshed in short period although it is sufficient for the other memory cells to be refreshed in long period. To solve this problem, the invention disclosed herein divides a word line to be selected by a refresh address into a plurality of word lines. The short period or long period is set for each divided word line according to the information retention time of the memory cells connected to the divided word line. Consequently, in the present invention, even if there exists even one memory cell to be refreshed in the short period, only the divided word line (one of N divided lines) connected to such a memory cell is refreshed in the short period, the other divided lines (N divided lines minus one) being refreshed in the long period. This novel setup makes longer the average refresh period, thereby lowering the power consumption.

Figure 28:
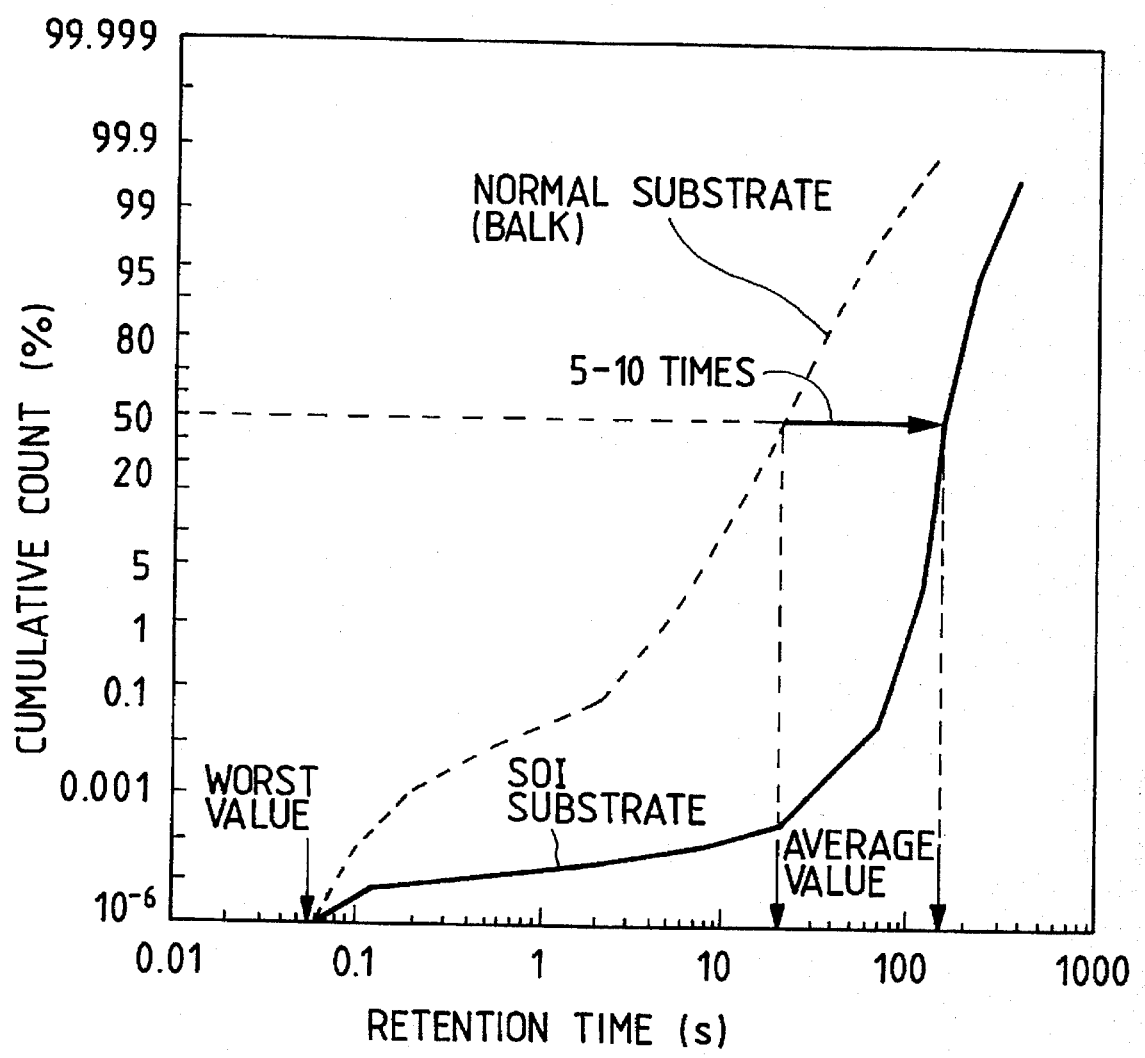
FIG. 28 is a characteristics diagram illustrating a relationship between information retention time and cumulative count of the dynamic RAM formed on an SOI substrate.

Referring to FIG. 28, there is shown a characteristics diagram illustrating a relationship between information retention time and cumulative count of a DRAM formed on SOI (Silicon On Insulator) substrate (the DRAM is also referred to as a SOI-DRAM hereinafter). In the figure, a characteristic of a DRAM formed on an ordinary substrate (bulk) is also shown in dots for comparison with that of the SOI-DRAM.

The average value of the retention time is improved by using the SOI substrate by about five to ten times over that obtained by using the ordinary substrate (bulk). This is because, with the DRAM memory cells formed on the SOI substrate, the bottom of their diffusion layer equivalent to an information storage node does not form, due to their structure, a pn junction by contacting the embedded oxide layer. Therefore, a leak current proportional to an area of the pn junction is significantly reduced, resulting in the above-mentioned improvement.

On the other hand, the worst value of the retention time is little improved even if the SOI substrate is used. Therefore, the retention time distribution has a pattern that has a tail toward shorter time as shown. It seems that the retention time in the tail portion is determined by a leak current caused by defects. Such defects are distributed in the substrate in a constant density. If any of the defects exists in the proximity of a junction, a leak current at the junction increases abnormally. With the SOI-DRAM, the possibility of occurrence of this problem is lower than that on the ordinary substrate because the smaller junction area. However, since the magnitude itself of the lead current does not depend on the junction area, the worst value itself of the retention is not improved.

As described, the retention times of most memory cells are improved on the SOI-DRAM. In the conventional refreshing, however, a refresh time cannot be extended effectively. In the refreshing according to the present invention, the memory cells in the above-mentioned tail portion and the other memory cells not affected by defect can be refreshed separately in suitable periods, thus realizing the DRAM of low power consumption making the most of the low lead current inherent to the SOI-DRAM.

The above-mentioned embodiments provide the following advantages:

(1) A refresh address to be commonly assigned to a plurality of word lines is generated by counting periodic pulses corresponding to a refresh period set shorter than the shortest information retention time of the information retention times of the above-mentioned dynamic memory cells. A carry signal from a refresh address counter that has counted the periodic pulses is divided by a divider. Either a short period equivalent to the output pulse of a timer circuit or a long period equivalent to the divided output pulse is stored in a memory circuit for each of the plurality of word lines assigned to the refresh address. A memory cell refresh operation to be performed by the refresh address is made valid or invalid for each word line according to the information stored in the memory circuit. The refresh time setting information is made invalid by the output pulse of the divider. According to the above-mentioned novel setup, a refresh operation may be performed by two or more refresh periods corresponding to memory cell information retention time for each of the plurality of word lines commonly assigned with the above-mentioned refresh address, resulting in significant power saving.

(2) Based on the above-mentioned refresh address, address selector provided in each of a plurality of array blocks is activated by a mat select signal to select each word line. At the same time, the above-mentioned mat select signal is made valid or invalid by the refresh time setting information stored in the above-mentioned storage circuit. This simple setup permits adaptive refreshing corresponding to the information retention time of memory cells connected to each word line of the plurality of array blocks, thereby reducing the power consumption.

(3) Provision of the adaptive refresh controller associated with the present invention on the SOI-DRAM allows the memory cells in the tail portion of the distribution and the other cells not affected by defect to be separately refreshed in suitable periods. This novel setup realizes the DRAM of low power consumption by making the most of the low leak current inherent to the SOI-DRAM.

(4) The above-mentioned divider is made to form a first divided output and a second divided output obtained by further dividing the first divided output. The above-mentioned refresh setting information is divided into a plurality of steps in correspondence with the first and second divided outputs. This novel setup reduces the power consumption still further.

(5) For the above-mentioned storage circuit, the nonvolatile memory cell of single-layer gate structure is used that comprises the first element forming area formed with the diffusion layer constituting the source and the drain, the second element forming area formed with the diffusion layer constituting a control gate, and the floating gate formed on the semiconductor substrate spanning over the first and second areas. This novel setup allows the PROM to be integrally fabricated with the DRAM by using the DRAM fabrication process without change.

(6) For the above-mentioned storage circuit, the address select MOSFET with the topmost metal wiring layer connected to the fuse in series is used as a memory cell. The fuse is selectively blown by high energy ray to effect the writing of storage information. This novel setup permits simple forming of the PROM.

(7) For the above-mentioned storage circuit, the dynamic memory cell is used. A high field is applied to the information storage capacitor of the memory cell to cause dielectric destruction for storage information writing. This novel setup permits simple forming of the PROM.

(8) The timer and the dividing ratio of the divider are made programmable for the information retention time of the memory cells formed on the dynamic RAM on which the timer and the divider are also formed. This novel setup permits an optimum refresh operation adapted to the fluctuation in the fabrication process.

(9) The refresh time setting information to be stored in the storage circuit is set such that the memory unwritten state provides the storage information for making valid a refresh operation to be performed in short period and the memory cell written state provides the storage information for making invalid the refresh operation to be performed in short period. This novel step prevents the data held in the memory from being destroyed by insufficient written information or volatilization, resulting in enhanced reliability.

(10) A memory module comprises a plurality of dynamic RAMs formed on a semiconductor substrate, the plurality of dynamic RAMs having a memory array arranged with dynamic memory cells in a matrix, an address select circuit for selecting the dynamic memory cells, and a controller for receiving one of a control signal supplied from an external terminal and a timing signal to determine an operating mode and form a corresponding timing signal; and an adaptive refresh controller having a timer circuit for generating a periodic pulse corresponding to a refresh period shorter than a shortest information retention time of those of the dynamic memory cells formed on the plurality of dynamic RAMs, a refresh address counter for counting an output pulse of the timer circuit to generate a refresh address of the plurality of dynamic RAMs, a divider for dividing a carry signal generated by the refresh address counter, and a storage circuit for storing refresh time setting information corresponding to one the output pulse of the timer circuit and the divided output of the divider according to the shortest information retention time of those of the dynamic memory cells connected to a word line to be selected by the refresh address in the plurality of dynamic RAMs, the storage circuit being read by the refresh address, wherein a refresh operation to be performed by the RAS-only refresh operation is made valid or invalid for each of the plurality of dynamic RAMs according to the refresh time setting information stored in the storage circuit and the refresh time setting information is made invalid by the output pulse of the divider. Both the plurality of dynamic RAMs and the adaptive refresh controller are arranged on a common mounting substrate. This novel setup significantly reduces the power consumption for the refresh operation on the memory module.

(11) The timer circuit and the dividing ratio of the divider are made programmable according to the information retention time of the memory cells formed on the dynamic RAM. This novel setup eliminates the necessity for selecting the types of dynamic RAMs to be installed and, at the same time, permits the setting of optimum refreshing.

(12) A first pulse corresponding to a refresh period shorter than a shortest information retention time of those of dynamic memory cells, a refresh address generated by counting the first pulse, and a second pulse generated by dividing a carry signal generated for each full refresh operation are formed, the refresh address is assigned with a plurality of word lines, refresh time setting information corresponding to one of the first pulse or the second pulse is stored in a storage circuit corresponding to each of the plurality of word lines assigned with the same refresh address, the refresh operation to be performed by the refresh address is made valid or invalid for each of the plurality of word lines according to the refresh time setting information read from the storage circuit, and the refresh time setting information itself is made invalid by the second pulse. This novel setup realizes a refresh operation adapted to the information retention time of the dynamic memory cells formed on the DRAM.

(13) The above-mentioned first and second pulses are set programmably according to the information retention time of the dynamic memory cells to be refreshed by these pulses. This novel setup realizes the refresh operation adapted to the fluctuation in the DRAM fabrication.

While the preferred embodiments of the present invention have been described using specific terms, such description is for illustrative purposes only, and it is to be understood that changes and variations may be made without departing from the spirit or scope of the appended claims. For example, in the embodiment of FIGS. 9 and 10, each of the two array blocks on both sides of the center area arranged with the XDEC, the ARYCTRL, and the I/O may be further divided into two array block corresponding to the Y addresses Y11 and /Y11, amounting to a total of eight array blocks, with resulting eight word lines being assigned by one refresh address. In this case, it is convenient, in the mat selector of FIG. 1, to form the mat select signals corresponding to the eight array blocks so that making valid or invalid the refresh operation is simply controlled for each refresh setting time information. Thus, the number of word lines, or the number of array blocks, to be specified by one refresh address may be embodied in a variety of ways according to the memory array layout scheme used.

The PROM in which the refresh time setting information is stored may be implemented by a variety of means including one using a nonvolatile memory cell composed of a ferroelectric capacitor and a MOSFET for address selection and another in which a fuse formed by polysilicon layer is electrically blown.

The constitution of the DRAM main, especially the method of dividing a memory array into mats and the method of selecting the mats may be embodied in a variety of ways. The embodiment in which the memory array is divided into a plurality of memory mats and word lines for refresh operation in each memory mats are selected simultaneously for circuit simplicity may also determine the refresh time setting information on a refresh address basis. In this case, the refresh time is determined by the memory cell having the shortest information retention time in the plurality of memory mats.

As for input/output interface, the DRAM may be embodied in a variety of manners including a DRAM controlled by control signals RAS, CAS and WE and a synchronous DRAM operated in synchronization with a clock signal and the 2-port memory having a random input/output circuit and a serial input/output circuit.

The effects to be typically obtained from the invention disclosed herein will be described as follows.

A refresh address to be commonly assigned to a plurality of word lines is generated by counting periodic pulses corresponding to a refresh period set shorter than the shortest information retention time of the information retention times of the above-mentioned dynamic memory cells. A carry signal from a refresh address counter that has counted the periodic pulses is divided by a divider. Either a short period equivalent to the output pulse of a timer circuit or a long period equivalent to the divided output pulse is stored in a memory circuit for each of the plurality of word lines assigned to the refresh address. A memory cell refresh operation to be performed by the refresh address is made valid or invalid for each word line according to the information stored in the memory circuit. The refresh time setting information is made invalid by the output pulse of the divider. According to the above-mentioned novel setup, a refresh operation may be performed by two or more refresh periods corresponding to memory cell information retention time for each of the plurality of word lines commonly assigned with the above-mentioned refresh address, resulting in significant power saving.

Based on the above-mentioned refresh address, address selector provided in each of a plurality of array blocks is activated by a mat select signal to select each word line. At the same time, the above-mentioned mat select signal is made valid or invalid by the refresh time setting information stored in the above-mentioned storage circuit. This simple setup permits adaptive refreshing corresponding to the information retention time of memory cells connected to each word line of the plurality of array blocks, thereby reducing the power consumption.

Provision of the adaptive refresh controller associated with the present invention on the SOI-DRAM allows the memory cells in the tail portion of the distribution and the other cells not affected by defect to be separately refreshed in suitable periods. This novel setup realizes the DRAM of low power consumption by making the most of the low leak current inherent to the SOI-DRAM.

The above-mentioned divider is made to form a first divided output and a second divided output obtained by further dividing the first divided output. The above-mentioned refresh setting information is divided into a plurality of steps in correspondence with the first and second divided outputs. This novel setup reduces the power consumption still further.

For the above-mentioned storage circuit, the nonvolatile memory cell of single-layer gate structure is used that comprises the first element forming area formed with the diffusion layer constituting the source and the drain, the second element forming area formed with the diffusion layer constituting a control gate, and the floating gate formed on the semiconductor substrate spanning over the first and second areas. This novel setup allows the PROM to be integrally fabricated with the DRAM by using the DRAM fabrication process without change.

For the above-mentioned storage circuit, the address select MOSFET with the topmost metal wiring layer connected to the fuse in series is used as a memory cell. The fuse is selectively blown by high energy ray to effect the writing of storage information. This novel setup permits simple forming of the PROM.

For the above-mentioned storage circuit, the dynamic memory cell is used. A high field is applied to the information storage capacitor of the memory cell to cause dielectric destruction for storage information writing. This novel setup permits simple forming of the PROM.

The timer and the dividing ratio of the divider are made programmable for the information retention time of the memory cells formed on the dynamic RAM on which the timer and the divider are also formed. This novel setup permits an optimum refresh operation adapted to the fluctuation in the fabrication process.

The refresh time setting information to be stored in the storage circuit is set such that the memory unwritten state provides the storage information for making valid a refresh operation to be performed in short period and the memory cell written state provides the storage information for making invalid the refresh operation to be performed in short period. This novel step prevents the data held in the memory from being destroyed by insufficient written information or volatilization, resulting in enhanced reliability.

The memory module comprises a plurality of dynamic RAMs formed on a semiconductor substrate, the plurality of dynamic RAMs having a memory array arranged with dynamic memory cells in a matrix, an address select circuit for selecting the dynamic memory cells, and a controller for receiving one of a control signal supplied from an external terminal and a timing signal to determine an operating mode and form a corresponding timing signal; and an adaptive refresh controller having a timer circuit for generating a periodic pulse corresponding to a refresh period shorter than a shortest information retention time of those of the dynamic memory cells formed on the plurality of dynamic RAMs, a refresh address counter for counting an output pulse of the timer circuit to generate a refresh address of the plurality of dynamic RAMs, a divider for dividing a carry signal generated by the refresh address counter, and a storage circuit for storing refresh time setting information corresponding to one the output pulse of the timer circuit and the divided output of the divider according to the shortest information retention time of those of the dynamic memory cells connected to a word line to be selected by the refresh address in the plurality of dynamic RAMs, the storage circuit being read by the refresh address, wherein a refresh operation to be performed by the RAS-only refresh operation is made valid or invalid for each of the plurality of dynamic RAMs according to the refresh time setting information stored in the storage circuit and the refresh time setting information is made invalid by the output pulse of the divider. Both the plurality of dynamic RAMs and the adaptive refresh controller are arranged on a common mounting substrate. This novel setup significantly reduces the power consumption for the refresh operation on the memory module.

The timer circuit and the dividing ratio of the divider are made programmable according to the information retention time of the memory cells formed on the dynamic RAM. This novel setup eliminates the necessity for selecting the types of dynamic RAMs to be installed and, at the same time, permits the setting of optimum refreshing.

A first pulse corresponding to a refresh period shorter than a shortest information retention time of those of dynamic memory cells, a refresh address generated by counting the first pulse, and a second pulse generated by dividing a carry signal generated for each full refresh operation are formed, the refresh address is assigned with a plurality of word lines, refresh time setting information corresponding to one of the first pulse or the second pulse is stored in a storage circuit corresponding to each of the plurality of word lines assigned with the same refresh address, the refresh operation to be performed by the refresh address is made valid or invalid for each of the plurality of word lines according to the refresh time setting information read from the storage circuit, and the refresh time setting information itself is made invalid by the second pulse. This novel setup realizes a refresh operation adapted to the information retention time of the dynamic memory cells formed on the DRAM.

The above-mentioned first and second pulses are set programmably according to the information retention time of the dynamic memory cells to be refreshed by these pulses. This novel setup realizes the refresh operation adapted to the fluctuation in the DRAM fabrication.

What is claimed is:

1. A dynamic memory device formed on a semiconductor substrate, said dynamic memory device having a plurality of memory blocks, a refresh address counter for receiving a periodic pulse signal to output a refresh address signal, a controller for receiving said refresh address signal, and a word line select circuit for receiving said refresh address signal;

said plurality of memory blocks including a first memory block having a plurality of first word lines and a plurality of first dynamic memory cells each of which is coupled to corresponding one of said plurality of first word lines and arranged in a matrix and a second memory block having a plurality of second word lines and a plurality of second dynamic memory cells each of which is coupled to corresponding one of said plurality of second word lines and arranged in a matrix;

said controller including a refresh period retention circuit for holding information about refresh periods each of which correspond to said plurality of first word lines and said plurality of second word lines; and wherein, if said refresh period retention circuit has information that a refresh period of one of said plurality of first word lines corresponding to said refresh address signal is a first refresh period and a refresh period of one of said plurality of second word lines corresponding to said refresh address signal is a second refresh period longer than said first refresh period, said controller performs one of control operations, said control operations including a first operation such that said word line select circuit simultaneously selects said one of said plurality of first word lines corresponding to said refresh address signal and said one of said plurality of second word lines corresponding to said refresh address signal and a second operation such that said word line select circuit selects said one of said plurality of first word lines corresponding to said refresh address signal and does not select said one of said plurality of second word lines corresponding to said refresh address signal.

2. A dynamic memory device formed on one semiconductor substrate, said dynamic memory device having a memory array arranged with dynamic memory cells in a matrix, an address select circuit for selecting said memory cells, and a controller for receiving one of a control signal supplied from an external terminal and a timing signal to determine an operating mode and form a corresponding timing signal;

said dynamic memory device comprising an adaptive refresh controller having a timer circuit for generating a periodic pulse corresponding to a refresh period shorter than a shortest information retention time of those of said dynamic memory cells, a refresh address counter for counting an output pulse of said timer circuit to generate a refresh address to be assigned commonly to a plurality of word lines, a divider for dividing a carry signal generated by said refresh address counter, and a storage circuit adapted to store one of refresh time setting information corresponding to the output pulse of said timer circuit and refresh time setting information corresponding to an output pulse of said divider for each of said plurality of word lines assigned to said refresh address, wherein a refresh operation to be performed by said refresh address is made valid or invalid for each of said plurality of word lines according to said refresh time setting information stored in said storage circuit and said refresh time setting information is made invalid by said output pulse of said divider.

3. A dynamic memory device according to claim 2, wherein said plurality of word lines assigned to said refresh address are provided for a plurality of array blocks, each of said plurality of array blocks is constituted by at least one memory mat having an X-decoder for word line selection, a word driver, a mat controller and a sense amplifier controller, and operations of said X-decoder, said word driver, said mat controller and said sense amplifier controller on said at least one memory mat are controlled by a corresponding mat select signal that is in turned controlled by the information stored in said storage circuit and said output pulse of said divider.

4. A dynamic memory device according to claim 3, wherein said dynamic memory cells are at least formed on a silicon-on-insulator substrate.

5. A dynamic memory device according to claim 2, 3 or 4, wherein said divider forms first divided outputs and second divided outputs obtained by further dividing the first divided outputs and said refresh time setting information is set in steps corresponding to the second divided outputs, and said refresh time setting information set in steps is made invalid by the second divided outputs.

6. A dynamic memory device according to claim 2, 3, 4 or 5, wherein said storage circuit is constituted by a memory cell of a single-layer structure having a first element forming area formed with a diffusion layer constituting a source and a drain, a second element forming area formed with a diffusion layer constituting a control gate, and a floating gate formed on the semiconductor substrate spanning both the first and second element forming areas and the information is written to said memory cell by electrically charging said floating gate.

7. A dynamic memory device according to claim 5, wherein said storage circuit uses a metal wiring layer, namely the top layer, as a fuse and uses a metal-oxide semiconductor field-effect transistor for address selection connected to said fuse as a memory cell, said fuse being selectively blown by a high-energy ray.

8. A dynamic memory device according to claim 5, wherein said storage circuit uses the dynamic memory cell of which information storage capacitor is dielectrically destroyed by high field to write the information to said dynamic memory cell.

9. A dynamic memory device according to claim 5, wherein said timer circuit and a dividing ratio of said divider are programmably set according to an information retention time of the memory cells formed on the dynamic memory on which said timer circuit and divider are mounted.

10. A dynamic memory device according to claim 9, wherein, in said storage circuit, an unwritten state provides stored information for making valid a refresh operation to be performed in synchronization with the output pulse of said timer circuit and a written state provides stored information for making invalid the refresh operation to be performed in synchronization with the output pulse of said timer circuit.

11. A memory module comprising:

a plurality of dynamic memory devices formed on a semiconductor substrate, said plurality of dynamic memory devices having a memory array arranged with dynamic memory cells in a matrix, an address select circuit for selecting said dynamic memory cells, and a controller for receiving one of a control signal supplied from an external terminal and a timing signal to determine an operating mode and form a corresponding timing signal; and an adaptive refresh controller having a timer circuit for generating a periodic pulse corresponding to a refresh period shorter than a shortest information retention time of those of said dynamic memory cells formed on said plurality of dynamic memory devices, a refresh address counter for counting an output pulse of said timer circuit to generate a refresh address of said plurality of dynamic memory devices, a divider for dividing a carry signal generated by said refresh address counter, and a storage circuit for storing refresh time setting information corresponding to one the output pulse of said timer circuit and the divided output of said divider according to the shortest information retention time of those of the dynamic memory cells connected to a word line to be selected by said refresh address in said plurality of dynamic memory devices, said storage circuit being read by said refresh address;

wherein a refresh operation to be performed by said refresh address is made valid or invalid for each of said plurality of dynamic memory devices according to said refresh time setting information stored in said storage circuit and said refresh time setting information is made invalid by said output pulse of said divider.

12. A memory module according to claim 11, wherein said adaptive refresh controller is formed on one semiconductor integrated circuit.

13. A memory module according to claim 11 or 12, wherein said timer circuit and a dividing ratio of said divider are programmably set according to the information retention times of said dynamic memory cells formed on said plurality of dynamic memory devices.

14. A method of refreshing a dynamic memory device, wherein a first pulse corresponding to a refresh period shorter than a shortest information retention time of those of dynamic memory cells, a refresh address generated by counting said first pulse, and a second pulse generated by dividing a carry signal generated for each full refresh operation are formed, said refresh address is assigned with a plurality of word lines, refresh time setting information corresponding to one of said first pulse or said second pulse is stored in a storage circuit corresponding to each of said plurality of word lines assigned with the same refresh address, the refresh operation to be performed by said refresh address is made valid or invalid for each of said plurality of word lines according to said refresh time setting information read from said storage circuit, and said refresh time setting information itself is made invalid by said second pulse.

15. A method of refreshing a dynamic memory device according to claim 14, wherein said first pulse and said second pulse are programmably set according to the information retention time of the dynamic memory cells to be refreshed.

* * * * *